(12) United States Patent
Tran

(10) Patent No.: US 11,989,440 B2
(45) Date of Patent: May 21, 2024

(54) HYBRID MEMORY SYSTEM CONFIGURABLE TO STORE NEURAL MEMORY WEIGHT DATA IN ANALOG FORM OR DIGITAL FORM

(71) Applicant: Silicon Storage Technology, Inc., San Jose, CA (US)

(72) Inventor: Hieu Van Tran, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 7 days.

(21) Appl. No.: 17/519,241

(22) Filed: Nov. 4, 2021

(65) Prior Publication Data
US 2023/0053608 A1 Feb. 23, 2023

Related U.S. Application Data

(60) Provisional application No. 63/232,149, filed on Aug. 11, 2021.

(51) Int. Cl.
| | |
|---|---|
| G11C 7/16 | (2006.01) |
| G06F 3/06 | (2006.01) |
| G06N 3/065 | (2023.01) |
| G11C 7/10 | (2006.01) |
| G11C 11/54 | (2006.01) |
| G11C 27/00 | (2006.01) |

(52) U.S. Cl.
CPC .......... *G06F 3/0655* (2013.01); *G06F 3/0604* (2013.01); *G06F 3/0679* (2013.01); *G06N 3/065* (2023.01); *G11C 7/1006* (2013.01); *G11C 7/16* (2013.01); *G11C 11/54* (2013.01); *G11C 27/005* (2013.01)

(58) Field of Classification Search
CPC .... G06F 3/0655; G06F 3/0604; G06F 3/0679; G06N 3/065; G06N 3/0442; G06N 3/0464; G11C 7/1006; G11C 7/16; G11C 11/54; G11C 27/005; G11C 11/005; G11C 11/5628; G11C 11/5642; H03M 1/46; H03M 1/742
USPC ............................................ 365/185.03, 205
See application file for complete search history.

(56) References Cited

U.S. PATENT DOCUMENTS

| | | |
|---|---|---|
| 5,029,130 A | 7/1991 | Yeh |
| 5,107,146 A | 4/1992 | El-Ayat |
| (Continued) | | |

FOREIGN PATENT DOCUMENTS

| | | |
|---|---|---|
| EP | 2 590 331 A2 | 5/2013 |
| TW | 201931214 A | 8/2019 |
| (Continued) | | |

OTHER PUBLICATIONS

PCT Search Report and Written Opinion dated Apr. 22, 2022 corresponding to PCT Patent Application No. US 2021/059286.

(Continued)

*Primary Examiner* — Michael T Tran
(74) *Attorney, Agent, or Firm* — DLA PIPER LLP US

(57) ABSTRACT

Numerous embodiments of a hybrid memory system are disclosed. The hybrid memory can store weight data in an array in analog form when used in an analog neural memory system or in digital form when used in a digital neural memory system. Input circuitry and output circuitry are capable of supporting both forms of weight data.

23 Claims, 39 Drawing Sheets

(56) References Cited

U.S. PATENT DOCUMENTS

| | | | |
|---|---|---|---|
| 5,335,355 A * | 8/1994 | Tanaka | H04W 88/02 |
| | | | 375/216 |
| 5,926,228 A * | 7/1999 | Jeon | H04N 5/46 |
| | | | 348/706 |
| 6,747,310 B2 | 6/2004 | Fan | |
| 10,748,360 B2 | 8/2020 | Telljohann | |
| 10,833,582 B1 * | 11/2020 | Coenen | H02M 3/07 |
| 2005/0207237 A1 * | 9/2005 | Isobe | G11C 29/02 |
| | | | 365/189.11 |
| 2009/0002206 A1 * | 1/2009 | Kremin | H03K 17/962 |
| | | | 341/33 |
| 2009/0251960 A1 * | 10/2009 | Schultz | G11C 11/1675 |
| | | | 365/158 |
| 2010/0182278 A1 * | 7/2010 | Li | G06F 3/04166 |
| | | | 345/174 |
| 2013/0002168 A1 * | 1/2013 | Rhodes | H05B 47/155 |
| | | | 315/307 |
| 2016/0248785 A1 * | 8/2016 | Petry | H04L 67/1097 |
| 2017/0148514 A1 * | 5/2017 | Lee | G11C 13/0002 |
| 2017/0337466 A1 | 11/2017 | Bayat et al. | |
| 2017/0338831 A1 * | 11/2017 | Yamaguchi | H03M 1/34 |
| 2019/0075130 A1 * | 3/2019 | Petry | H04L 63/1483 |
| 2019/0288829 A1 * | 9/2019 | Iguchi | H03K 17/687 |
| 2019/0342053 A1 * | 11/2019 | Peng | H04L 1/1607 |
| 2020/0005864 A1 * | 1/2020 | Gangasani | G11C 13/0069 |
| 2020/0081059 A1 * | 3/2020 | Ducrey | G01R 31/2884 |
| 2020/0134268 A1 * | 4/2020 | Frantz | G06G 7/06 |
| 2020/0228561 A1 * | 7/2020 | Petry | H04L 67/53 |
| 2020/0349421 A1 | 11/2020 | Tran et al. | |
| 2020/0372949 A1 * | 11/2020 | Zhao | G11C 13/0069 |
| 2021/0185443 A1 * | 6/2021 | Lesso | H03G 5/165 |
| 2021/0200258 A1 * | 7/2021 | Malevsky | G06F 1/04 |

FOREIGN PATENT DOCUMENTS

| | | | | |
|---|---|---|---|---|
| TW | 202105259 A | | 2/2021 | |
| WO | 2011/119307 A1 | | 9/2011 | |
| WO | 2020/159581 A1 | | 8/2020 | |
| WO | WO-2020243300 A1 * | 12/2020 | | E03B 7/12 |

OTHER PUBLICATIONS

Zheng Qilin et al, "MobiLattice: A Depth-Wise DCNN Accelerator With Hybrid Digital/Analog Nonvolatile Processing-In-Memory Block," 2020 IEEE/ACM, pp. 1-9, Nov. 2, 2020.

Taiwanese Office Action dated Jun. 2, 2023 corresponding to the related Taiwanese Patent Application No. 111128273.

Taiwanese Office Action issued on Mar. 18, 2024 corresponding to the related Taiwanese Patent Application No. 111128273.

* cited by examiner

FIGURE 17
LSTM Cell
1700
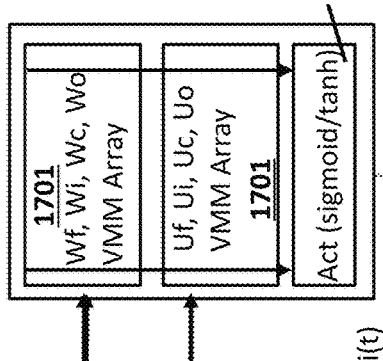
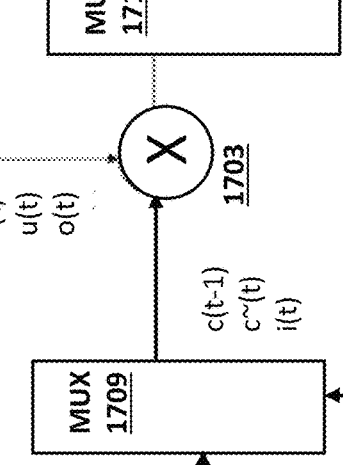

2900

FIGURE 32
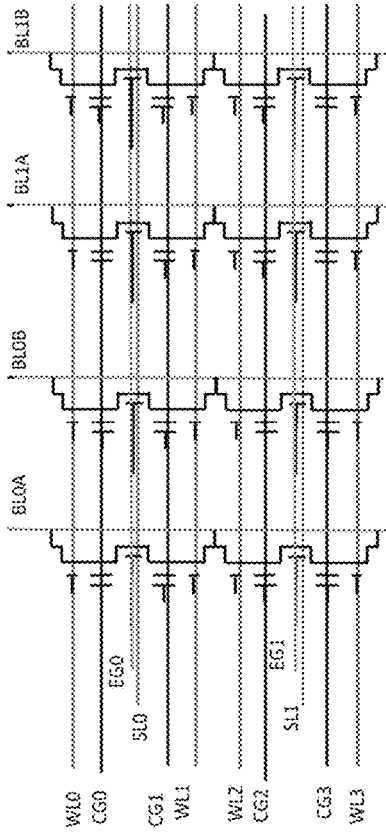
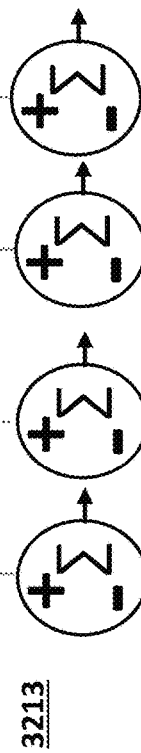
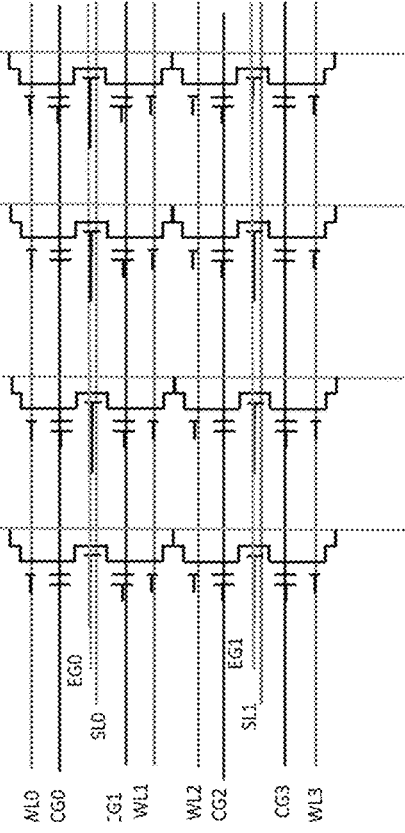

HYBRID MEMORY SYSTEM CONFIGURABLE TO STORE NEURAL MEMORY WEIGHT DATA IN ANALOG FORM OR DIGITAL FORM

PRIORITY CLAIM

This application claims priority from U.S. Provisional Application No. 63/232,149, filed on Aug. 11, 2021, and titled, "Hybrid Memory System Configurable to Store Neural Memory Weight Data in Analog Form or Digital Form," which is incorporated by reference herein.

FIELD OF THE INVENTION

Numerous embodiments of a hybrid memory system are disclosed. The hybrid memory can store weight data in an array in analog form when used in an analog neural memory system or in digital form when used in a digital neural memory system. Input circuitry and output circuitry is capable of supporting both forms of weight data.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neural memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 110 for performing read, erase, and program operations:

TABLE NO. 1

Operation of Flash Memory Cell 210 of FIG. 3

|  | WL | BL | SL |
|---|---|---|---|
| Read | 2-3 V | 0.6-2 V | 0 V |
| Erase | ~11-13 V | 0 V | 0 V |
| Program | 1-2 V | 10.5-3 µA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO. 2

Operation of Flash Memory Cell 310 of FIG. 3

|  | WL/SG | BL | CG | EG | SL |
|---|---|---|---|---|---|
| Read | 1.0-2 V | 0.6-2 V | 0-2.6 V | 0-2.6 V | 0 V |
| Erase | -0.5 V/0 V | 0 V | 0 V/-8 V | 8-12 V | 0 V |
| Program | 1 V | 0.1-1 µA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage and current ranges that can be applied to the terminals of memory cell 410 for performing read, erase, and program operations:

TABLE NO. 3

Operation of Flash Memory Cell 410 of FIG. 4

|  | WL/SG | BL | EG | SL |
|---|---|---|---|---|
| Read | 0.7-2.2 V | 0.6-2 V | 0-2.6 V | 0 V |
| Erase | -0.5 V/0 V | 0 V | 11.5 V | 0 V |
| Program | 1 V | 0.2-3 µA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO. 4

Operation of Flash Memory Cell 510 of FIG. 5

|  | CG | BL | SL | Substrate |
|---|---|---|---|---|
| Read | 2-5 V | 0.6-2 V | 0 V | 0 V |
| Erase | -8 to -10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tanh, or ReLU functions. The rectified output values of activation function block 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31 and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e. the memory cells 310 of VMM array 900, are preferably configured to operate in a sub-threshold region.

The non-volatile reference memory cells and the non-volatile memory cells described herein are biased in weak inversion (sub threshold region):

$$Ids = Io * e^{(Vg-Vth)/nVt} = w * Io * e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg = n*Vt*\log[Ids/wp*Io]$$

where, wp is w of a reference or peripheral memory cell.

For a memory array used as a vector matrix multiplier VMM array with the current input, the output current is:

$$Iout = wa * Io * e^{(Vg)/nVt}, \text{namely}$$

$$Iout = (wa/wp) * Iin = W * Iin$$

$$W = e^{(Vthp-Vtha)/nVt}$$

Here, wa=w of each memory cell in the memory array.

Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth = Vth0 + gamma(SQRT|Vsb - 2*\varphi F| - SQRT|2*\varphi F|)$$

Where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids = \text{beta}*(Vgs-Vth)*Vds; \text{beta} = u*Cox*Wt/L$$

$$W = \alpha(Vgs-Vth)$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids = \frac{1}{2}*\text{beta}*(Vgs-Vth)^2; \text{beta} = u*Cox*Wt/L$$

$$W\alpha(Vgs-Vth)^2, \text{ meaning weight } W \text{ is proportional to } (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other embodiments for VMM array 32 of FIG. 7 are described in U.S. Pat. No. 10,748,630, which is incorporated by reference herein. As described in that application, a sourceline or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference)

operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

| | | | | | | |
|---|---|---|---|---|---|---|
| | | Operation of VMM Array 1000 of FIG. 10: | | | | |
| | WL | WL - unsel | BL | BL - unsel | SL | SL - unsel |
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 11 depicts neuron VMM array 1100, which is particularly suited for memory cells 210 as shown in FIG. 2 and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| | | | | | | |
|---|---|---|---|---|---|---|
| | | Operation of VMM Array 1100 of FIG. 11 | | | | |
| | WL | WL - unsel | BL | BL - unsel | SL | SL - unsel |
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1200 of FIG. 12

|  | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

Operation of VMM Array 1300 of FIG. 13

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-1 V | 0-2.6 V | 0-2.6 V | 4.5-5 V | 0-2.6 V | 4.5-5 V | 0-1 V |

FIG. 22 depicts neuron VMM array 2200, which is particularly suited for memory cells 210 as shown in FIG. 2 and is utilized as the synapses and parts of neurons between an input layer and the next layer. In VMM array 2200, the inputs $INPUT_0$, ..., $INPUT_N$ are received on bit lines $BL_0$, ..., $BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

FIG. 23 depicts neuron VMM array 2300, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0$, ... $OUTPUT_N$ are generated on bit lines $BL_0$, ..., $BL_N$.

FIG. 24 depicts neuron VMM array 2400, which is particularly suited for memory cells 210 as shown in FIG. 2, and is utilized as the synapses and parts of neurons between an input layer and the next layer. In this example, the inputs $INPUT_0$, ..., $INPUT_M$ are received on word lines $WL_0$, ..., $WL_M$, respectively, and the outputs $OUTPUT_0$, ... $OUTPUT_N$ are generated on bit lines $BL_0$, ..., $BL_N$.

FIG. 25 depicts neuron VMM array 2500, which is particularly suited for memory cells 310 as shown in FIG. 3, and is utilized as the synapses and parts of neurons between an input layer and the next layer. In this example, the inputs $INPUT_0$, ..., $INPUT_M$ are received on word lines $WL_0$, ..., $WL_M$, respectively, and the outputs $OUTPUT_0$, ... $OUTPUT_N$ are generated on bit lines $BL_0$, ..., $BL_N$.

FIG. 26 depicts neuron VMM array 2600, which is particularly suited for memory cells 410 as shown in FIG. 4, and is utilized as the synapses and parts of neurons between an input layer and the next layer. In this example, the inputs $INPUT_0$, ..., $INPUT_N$ are received on vertical control gate lines $CG_0$, ..., $CG_N$, respectively, and the outputs $OUTPUT_1$ and $OUTPUT_2$ are generated on source lines $SL_0$ and $SL_1$.

FIG. 27 depicts neuron VMM array 2700, which is particularly suited for memory cells 410 as shown in FIG. 4, and is utilized as the synapses and parts of neurons between an input layer and the next layer. In this example, the inputs $INPUT_0$, ..., $INPUT_N$ are received on the gates of bit line control gates 2701-1, 2701-2, ..., 2701-(N−1), and 2701-N, respectively, which are coupled to bit lines $BL_0$, ..., $BL_N$, respectively. Exemplary outputs $OUTPUT_1$ and $OUTPUT_2$ are generated on source lines $SL_0$ and $SL_1$.

FIG. 28 depicts neuron VMM array 2800, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, ..., $INPUT_M$ are received on word lines $WL_0$, ..., $WL_M$, and the outputs $OUTPUT_0$, ..., $OUTPUT_N$ are generated on bit lines $BL_0$, ..., $BL_N$, respectively.

FIG. 29 depicts neuron VMM array 2900, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, ..., $INPUT_M$ are received on control gate lines $CG_0$, ..., $CG_M$. Outputs $OUTPUT_0$, ..., $OUTPUT_N$ are generated on vertical source lines $SL_0$, ..., $SL_N$, respectively, where each source line $SL_i$ is coupled to the source lines of all memory cells in column i.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, ..., $INPUT_M$ are received on control gate lines $CG_0$, ..., $CG_M$. Outputs $OUTPUT_0$, ..., $OUTPUT_N$ are generated on vertical bit lines $BL_0$, ..., $BL_N$, respectively, where each bit line $BL_i$ is coupled to the bit lines of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

FIG. 14 depicts an exemplary LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an exemplary implementation of an LSTM cell 1500, which can be used for cells 1401, 1402, 1403, and 1404 in FIG. 14. LSTM cell 1500 receives input vector x(t), cell state vector c(t−1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tanh devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tanh device 1504 each comprise multiple VMM arrays 1601 and activation function blocks 1602, Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTM cell 1600 (and another example of an implementation of LSTM cell 1500) is shown in FIG. 17. In FIG. 17, sigmoid function devices 1501, 1502, and 1503 and tanh device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tanh device 1505 (which comprises activation function block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t) u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM cell 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore reduce the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $x_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an exemplary implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t), GRU cell 1900 comprises sigmoid function devices 1901 and 1902, each of which applies a number between 0 and 1 to components from output vector h(t−1) and input vector x(t). GRU cell 1900 also comprises a tanh device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tanh device 1903 each comprise multiple VMM arrays 2001 and activation function blocks 2002. Thus, it can be seen that VMM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tanh device 1903 share the same physical hardware (VIM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1) *z(t) when that value is output from multiplier device 2103 through multiplexor 2104, and register 2108 to hold the value hˆ(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. GRU cell 2100 will require less space than GRU cell 2000, as GRU cell 2100 will require ⅓ as much space for VMMs and activation function blocks compared to GRU cell 2000.

It can be further appreciated that (31W systems will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore reduce the circuitry required outside of the VMM arrays themselves.

The input to the VMM arrays can be an analog level, a binary level, a pulse, a time modulated pulse, or digital bits (in this case a DAC is needed to convert digital bits to appropriate input analog level) and the output can be an analog level, a binary level, a timing pulse, pulses, or digital bits (in this case an output ADC is needed to convert output analog level into digital bits).

In general, for each memory cell in a VMM array, each weight W can be implemented by a single memory cell or by a differential cell or by two blend memory cells (average of 2 cells). In the differential cell case, two memory cells are needed to implement a weight W as a differential weight (W=W+−W−). In the two blend memory cells, two memory cells are needed to implement a weight W as an average of two cells.

FIG. 31 depicts VMM system 3100. In some embodiments, the weights, W, stored in a VMM array are stored as differential pairs, W+ (positive weight) and W− (negative weight), where W=(W+)−(W−). In VMM system 3100, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3101 and 3102. The output of a W+ line and the output of a W− line are combined together to give effectively W=W+−W− for each pair of (W+, W−) cells for all pairs of (W+, W−) lines. While the above has been described in relation to W− lines interspersed among the W+ lines in an alternating fashion, in other embodiments W+ lines and W− lines can be arbitrarily located anywhere in the array.

FIG. 32 depicts another embodiment. In VMM system 3210, positive weights W+ are implemented in first array 3211 and negative weights W− are implemented in a second array 3212, second array 3212 separate from the first array, and the resulting weights are appropriately combined together by summation circuits 3213.

FIG. 33 depicts VMM system 3300. the weights, W, stored in a VMM array are stored as differential pairs, W+ (positive weight) and W− (negative weight), where W=(W+)−(W−). VMM system 3300 comprises array 3301 and array 3302. Half of the bit lines in each of array 3301 and 3302 are designated as W+ lines, that is, bit lines connecting to memory cells that will store positive weights W+, and the other half of the bit lines in each of array 3301 and 3302 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3303, 3304, 3305, and 3306. The output of a W+ line and the output of a W− line from each array 3301, 3302 are respectively combined together to give effectively W=W+−W− for each pair of (W+, W−) cells for all pairs of (W+, W−) lines. In addition, the W values from each array 3301 and 3302 can be further combined through summation circuits 3307 and 3308, such that each W value is the result of a W value from array 3301 minus a W value from array 3302, meaning that the end result from summation circuits 3307 and 3308 is a differential value of two differential values.

Each non-volatile memory cells used in the analog neural memory system is to be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

Similarly, a read operation must be able to accurately discern between N different levels.

There is a need for a flexible memory system that can operate as an analog neural memory system in one mode and can also operate as a digital neural memory system in another mode.

SUMMARY OF THE INVENTION

Numerous embodiments of a hybrid memory system are disclosed. The hybrid memory can store weight data in an array in analog form when used in an analog neural memory system or in digital form when used in a digital neural memory system. Input circuitry and output circuitry is capable of supporting both forms of weight data.

BRIEF DESCRIPTION OF THE DRAWINGS

FIG. 17 depicts another embodiment of the exemplary cell of FIG. 15.

FIG. 32 depicts another embodiment of a vector-by-matrix multiplication system.

DETAILED DESCRIPTION OF THE INVENTION

The artificial neural networks of the present invention utilize a combination of CMOS technology and non-volatile memory arrays.

VMM System Overview

Figure 1:
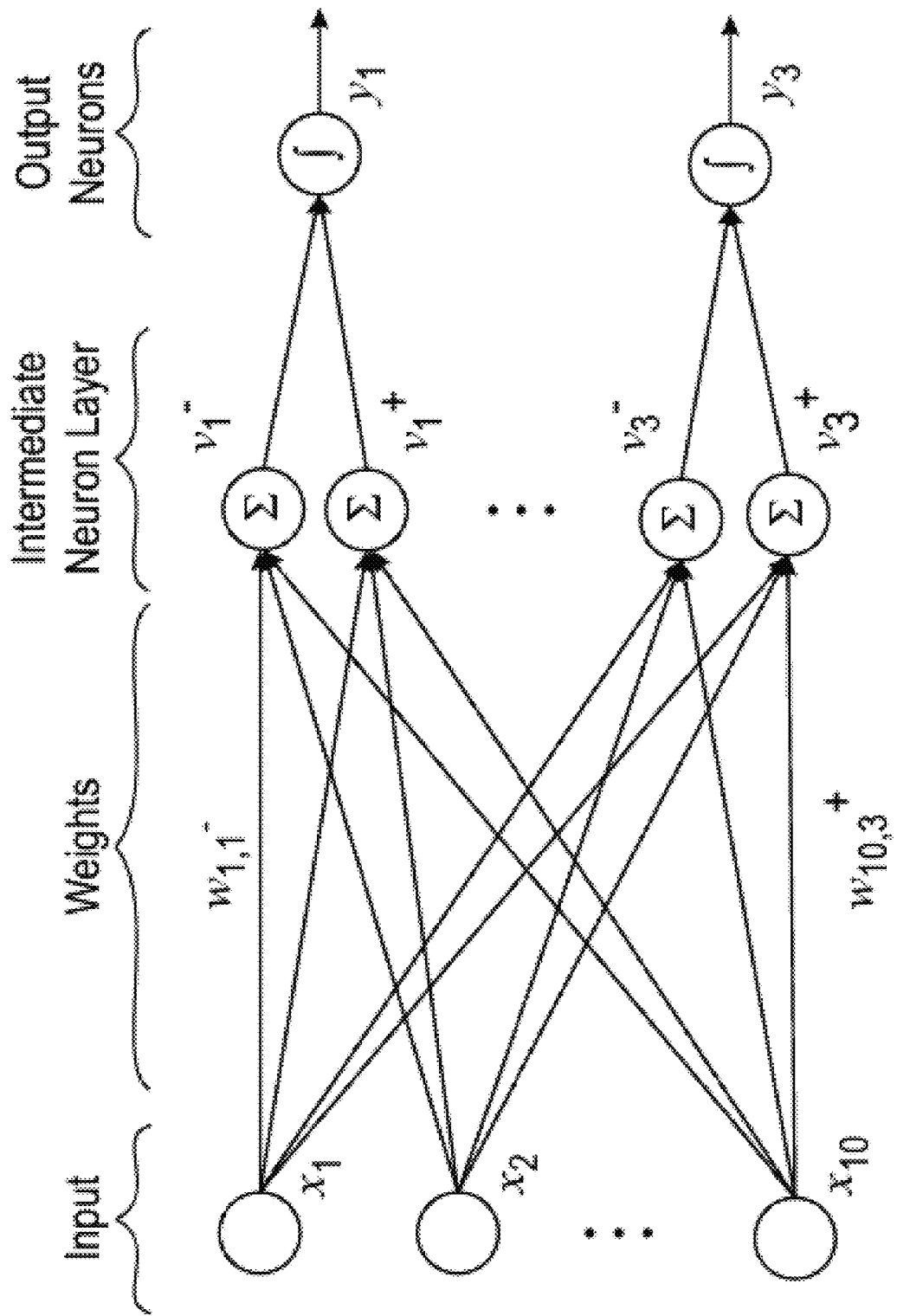
FIG. 1 is a diagram that illustrates an artificial neural network.
Figure 2:
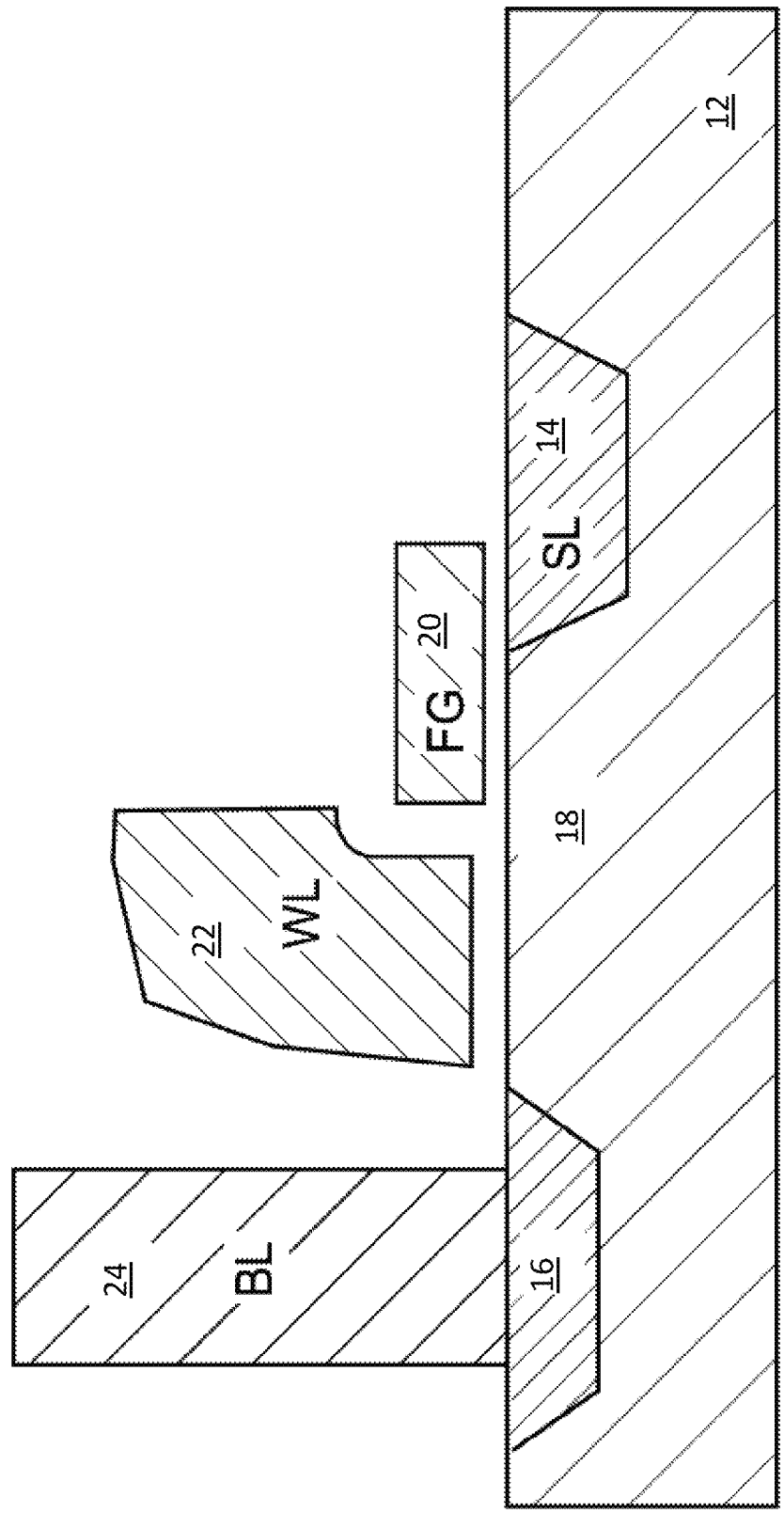
FIG. 2 depicts a prior art split gate flash memory cell.
Figure 3:
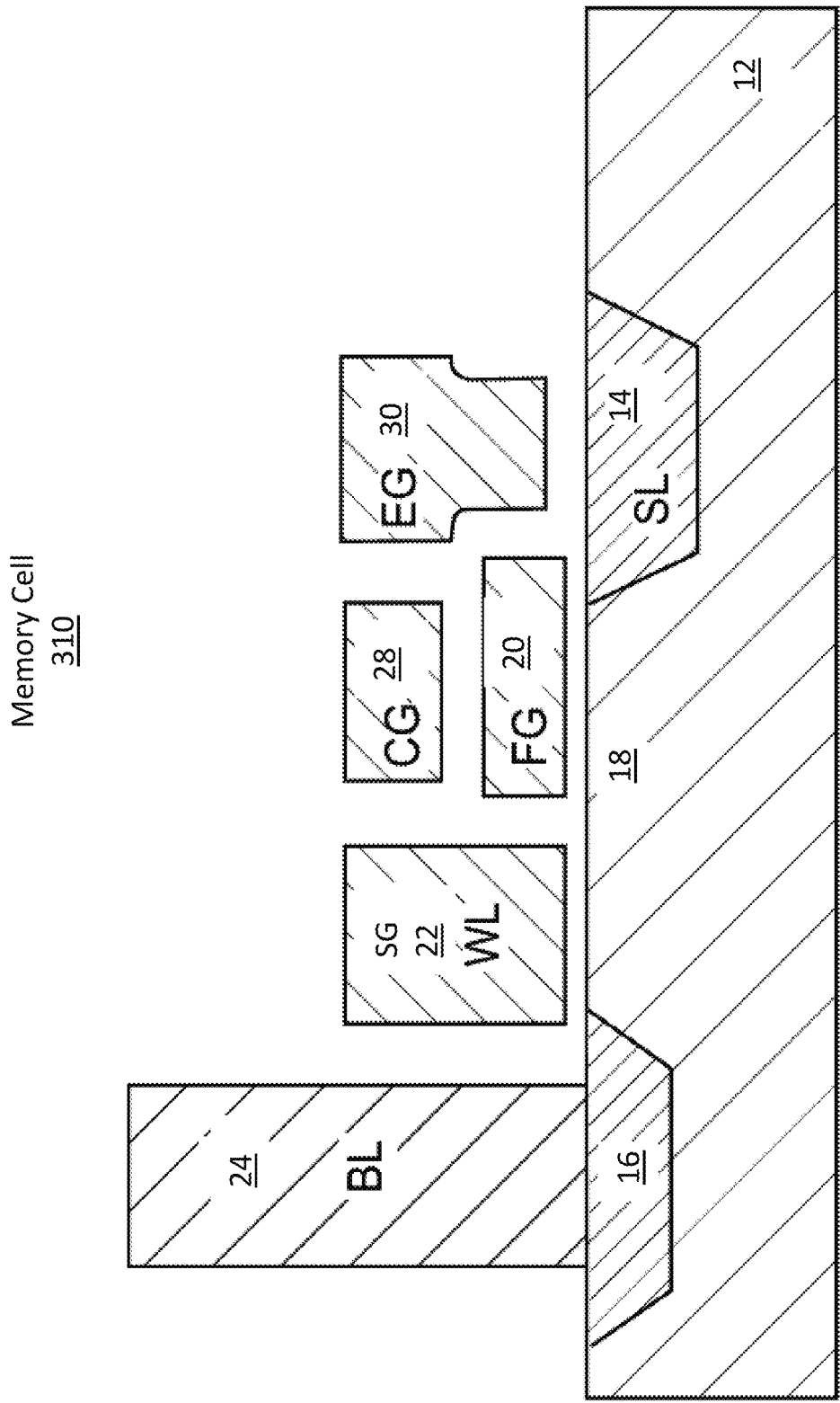
FIG. 3 depicts another prior art split gate flash memory cell.
Figure 4:
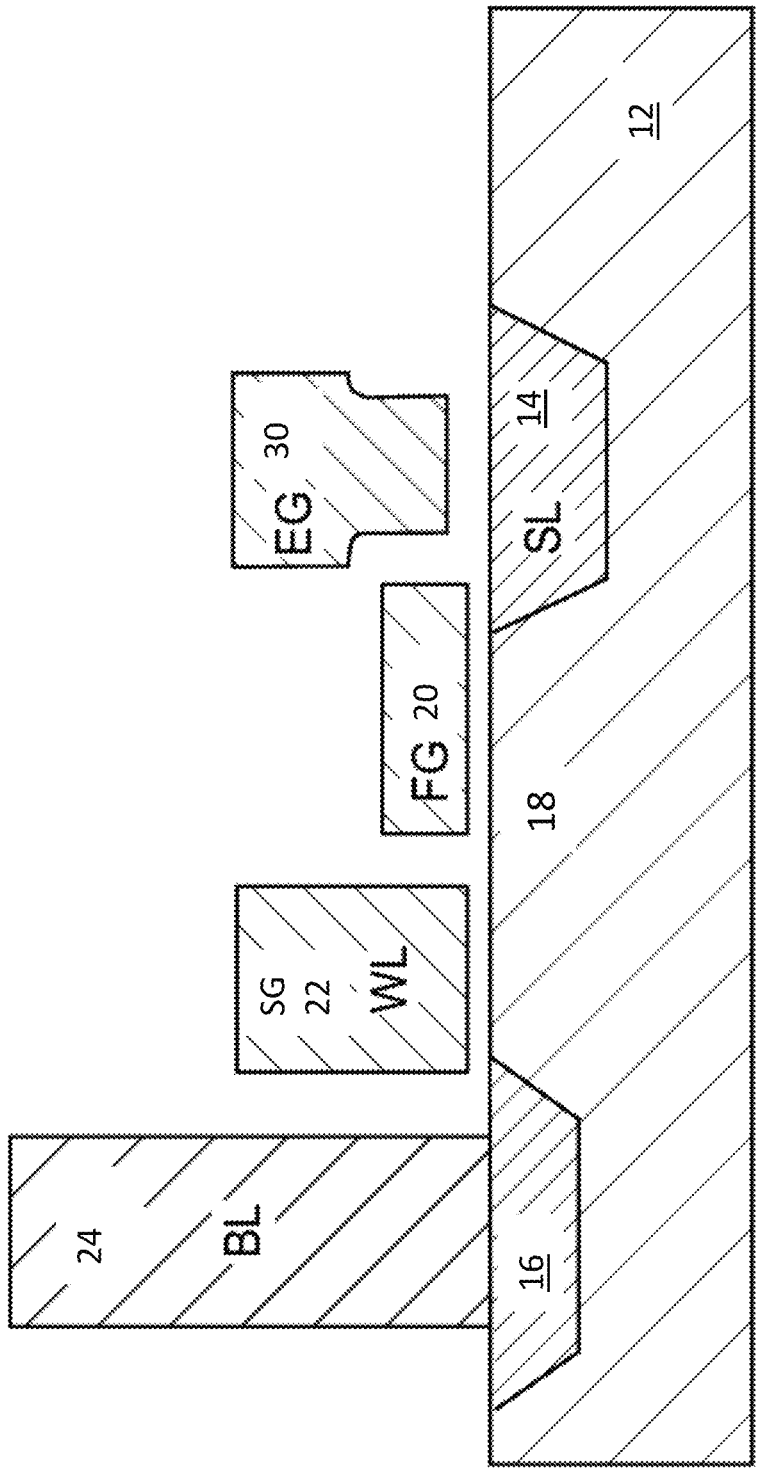
FIG. 4 depicts another prior art split gate flash memory cell.
Figure 5:
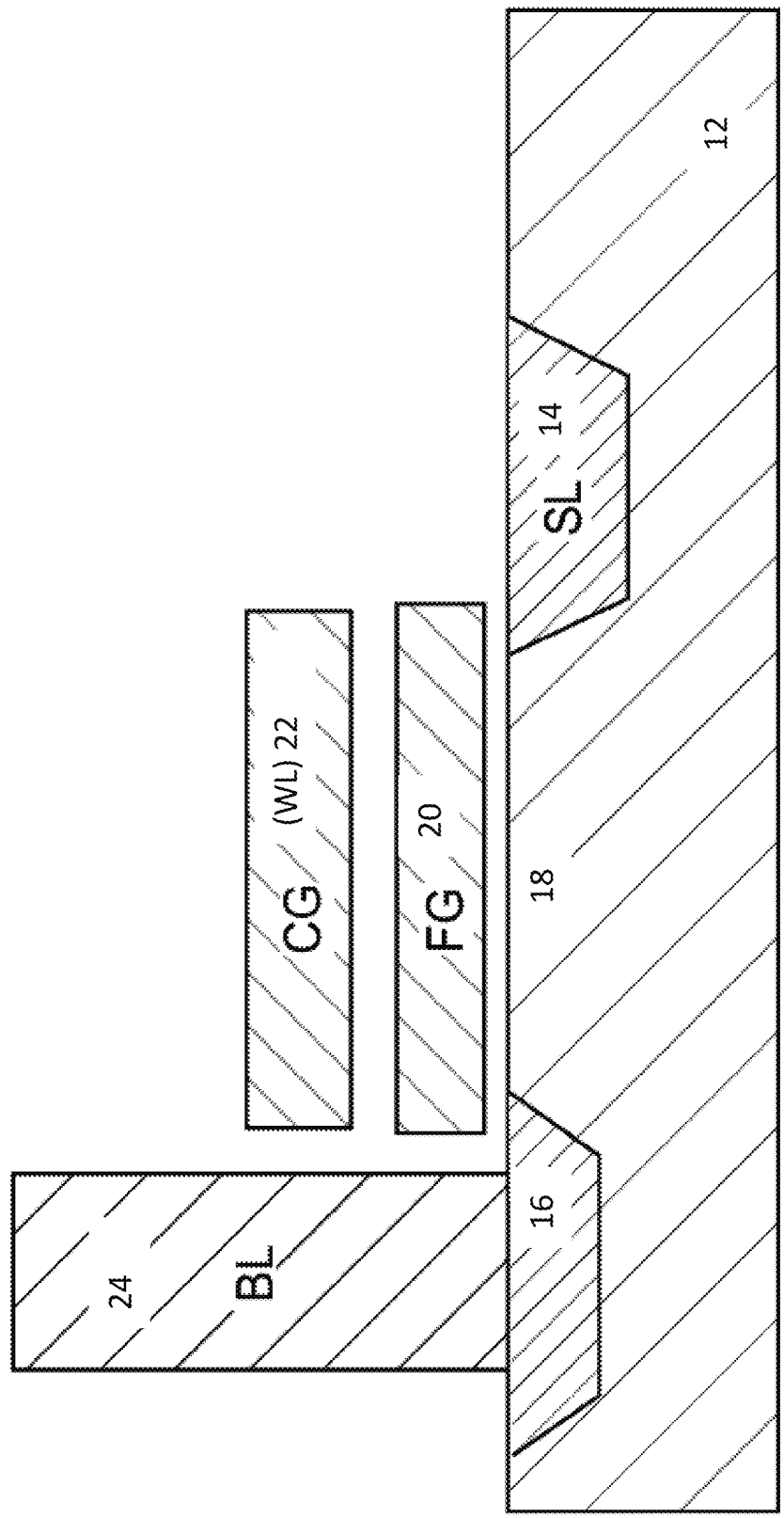
FIG. 5 depicts another prior art split gate flash memory cell.
Figure 6:
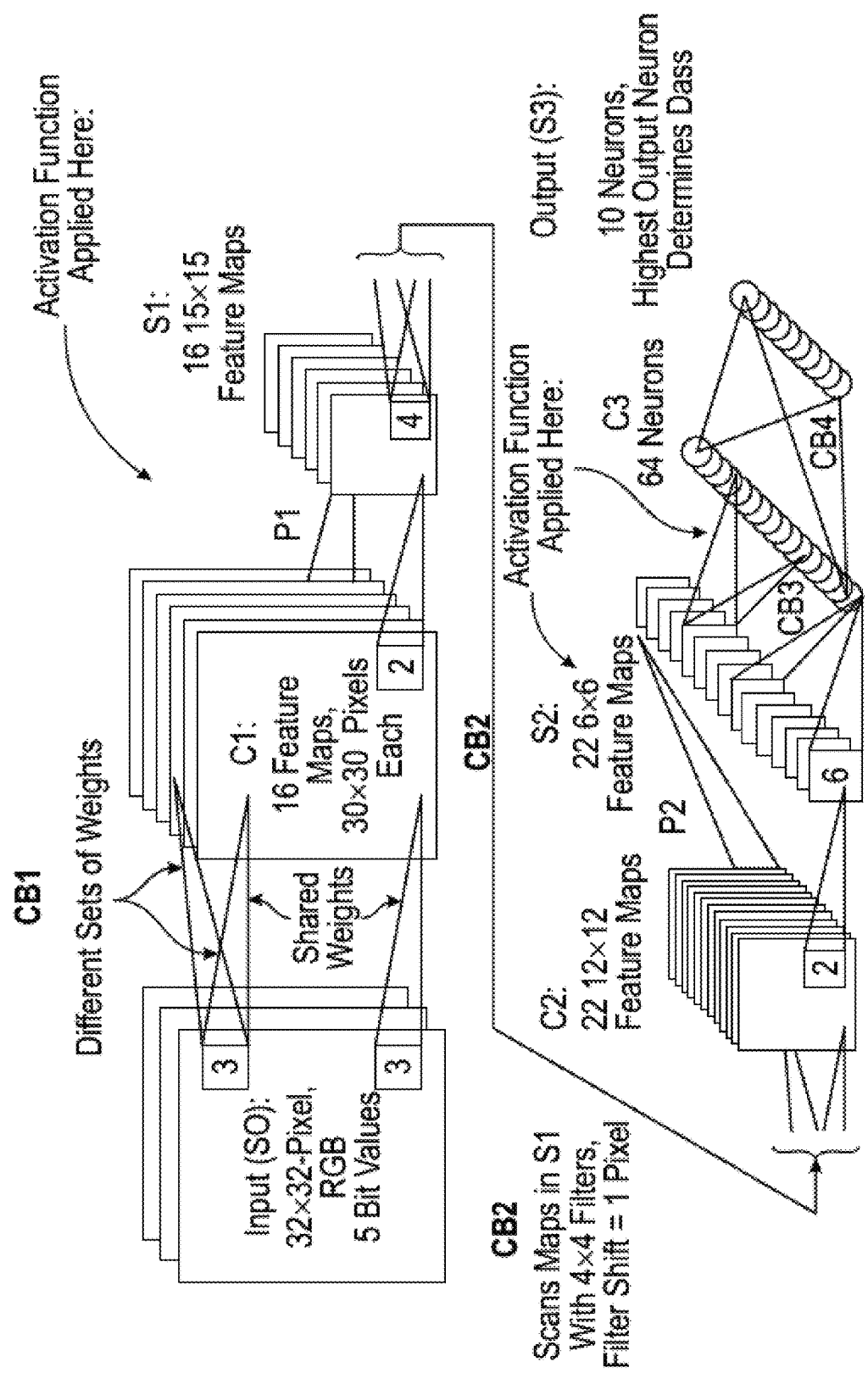
FIG. 6 is a diagram illustrating the different levels of an exemplary artificial neural network utilizing one or more non-volatile memory arrays.
Figure 7:
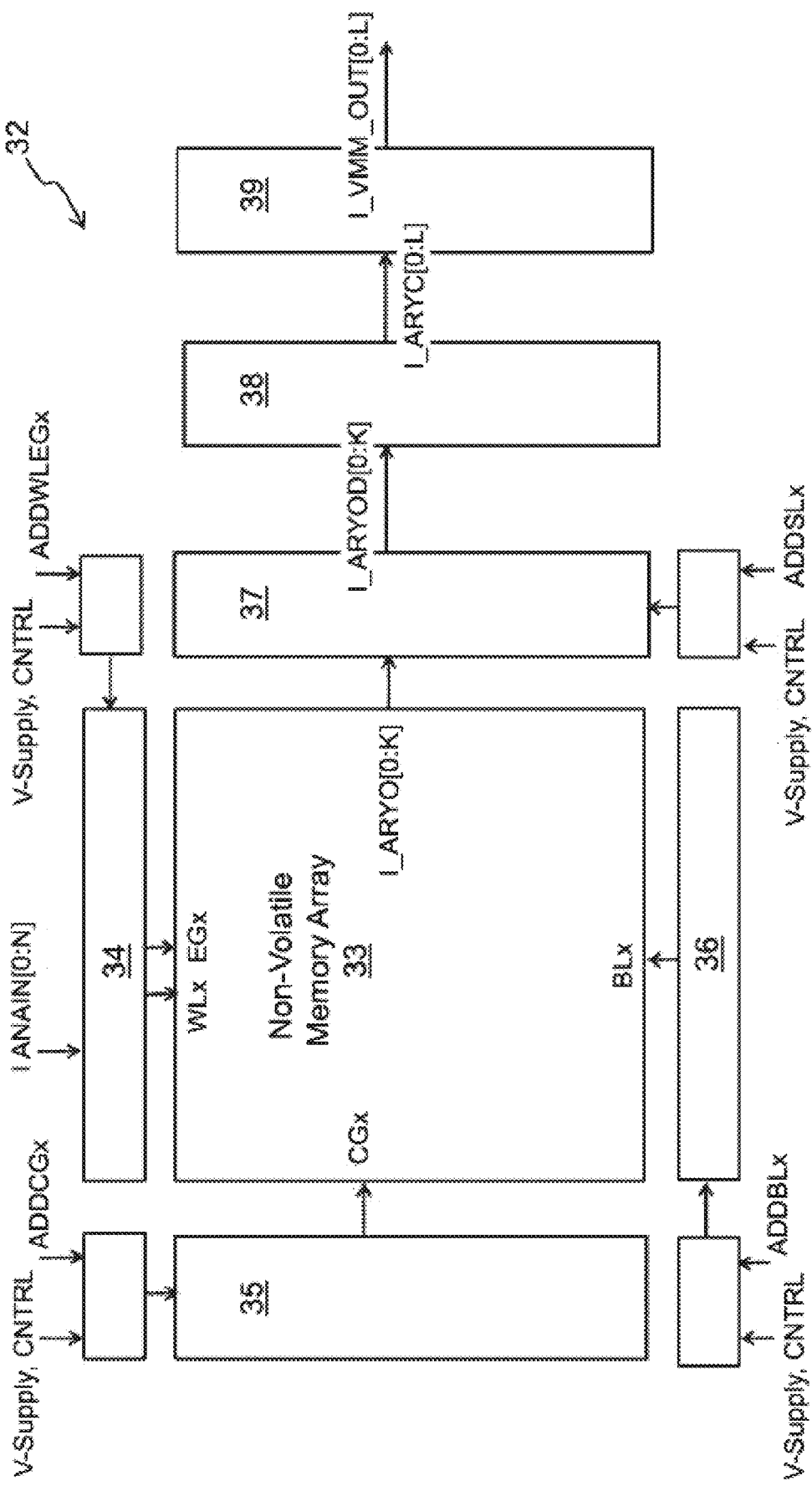
FIG. 7 is a block diagram illustrating a vector-by-matrix multiplication system.
Figure 8:
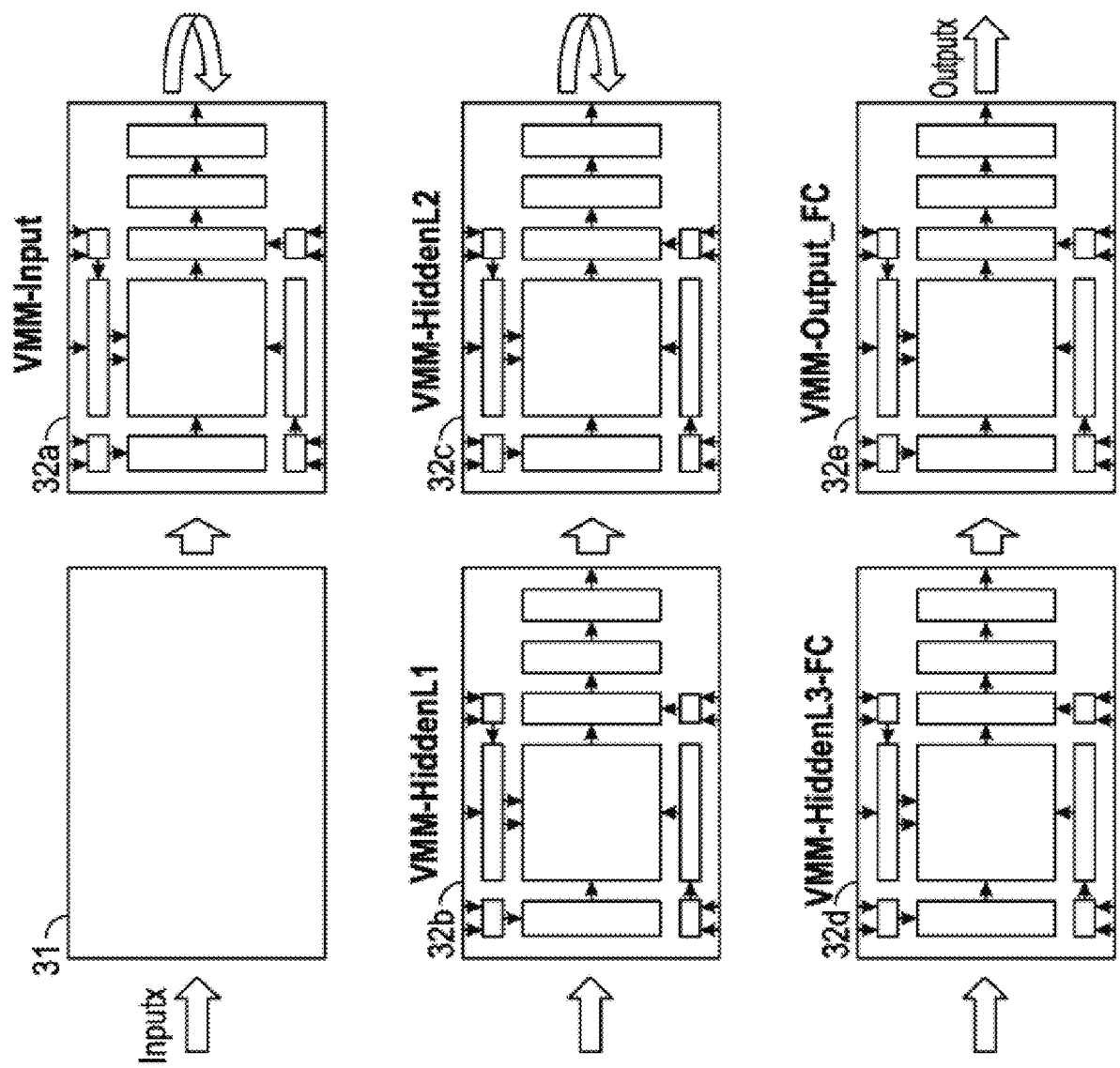
FIG. 8 is a block diagram illustrates an exemplary artificial neural network utilizing one or more vector-by-matrix multiplication systems.
Figure 9:
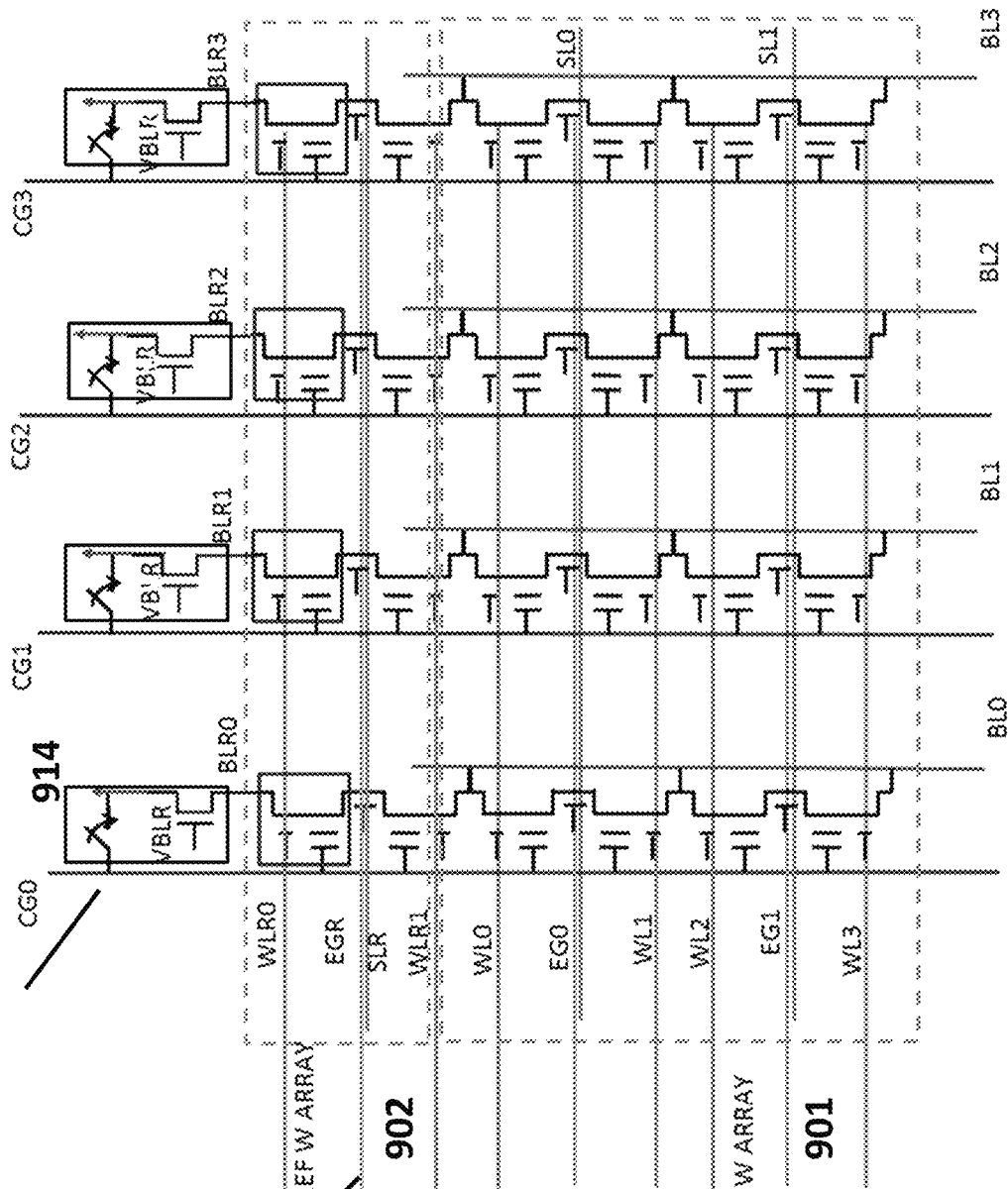
FIG. 9 depicts another embodiment of a vector-by-matrix multiplication system.
Figure 10:
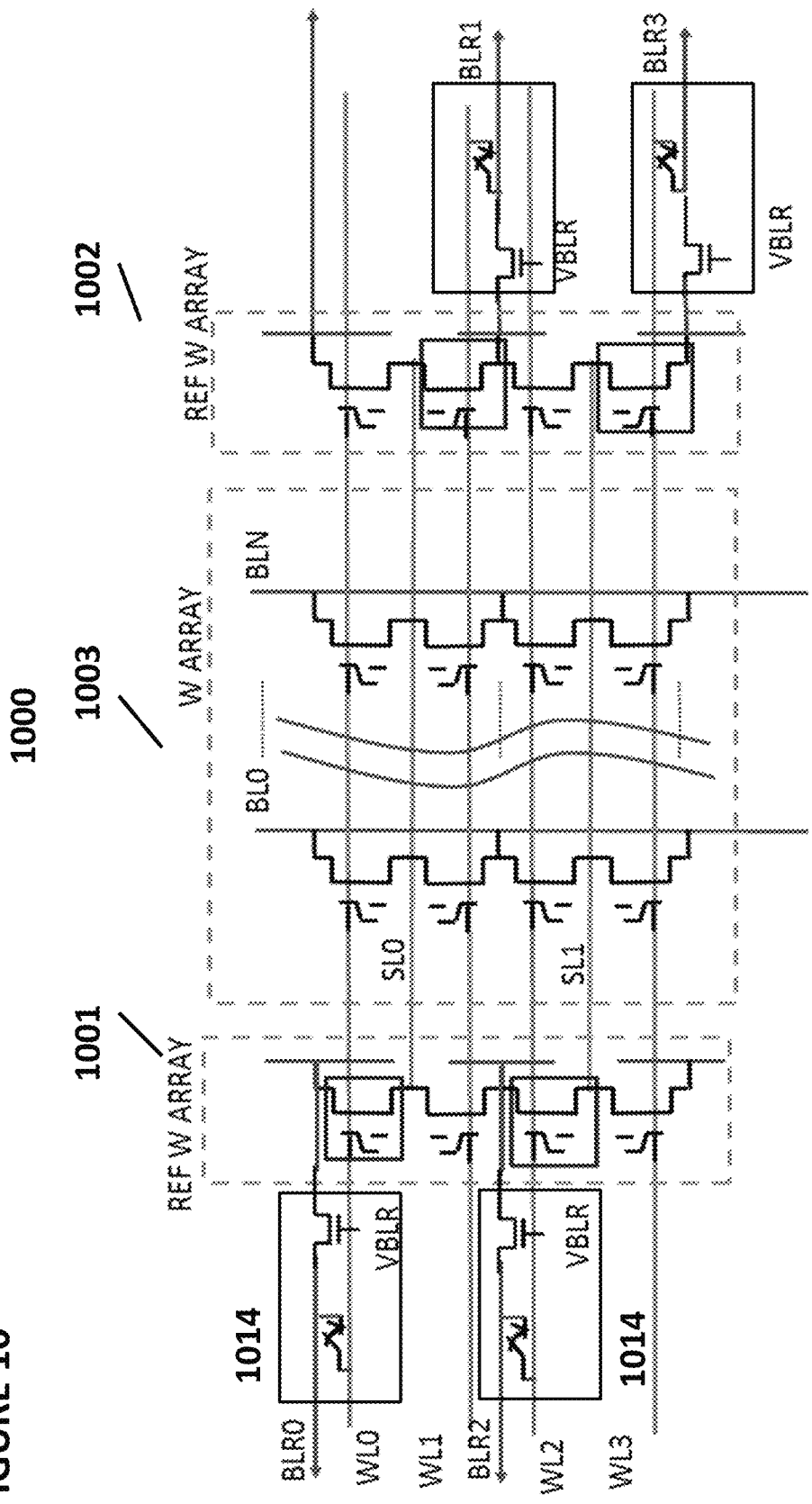
FIG. 10 depicts another embodiment of a vector-by-matrix multiplication system.
Figure 11:
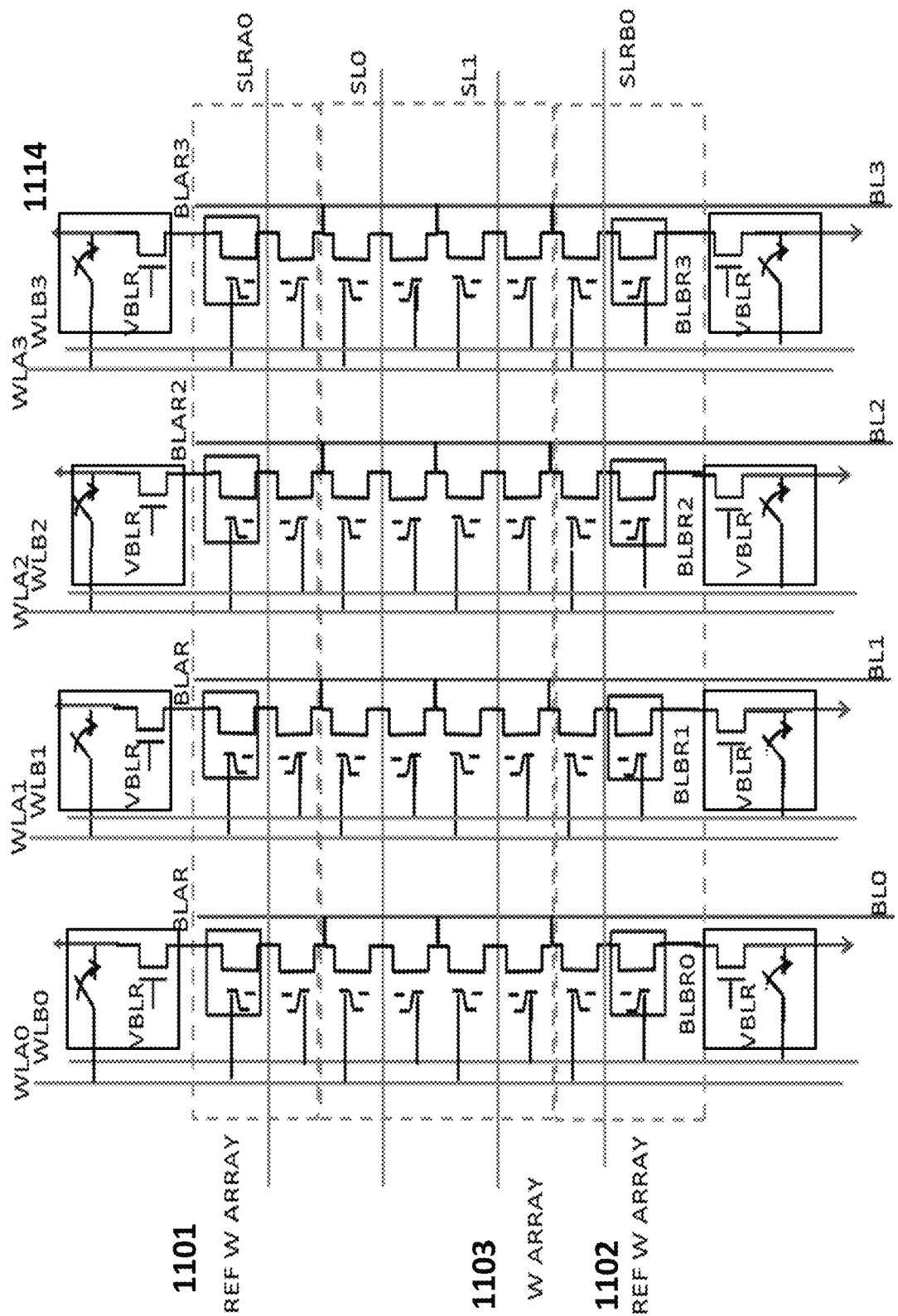
FIG. 11 depicts another embodiment of a vector-by-matrix multiplication system.
Figure 12:
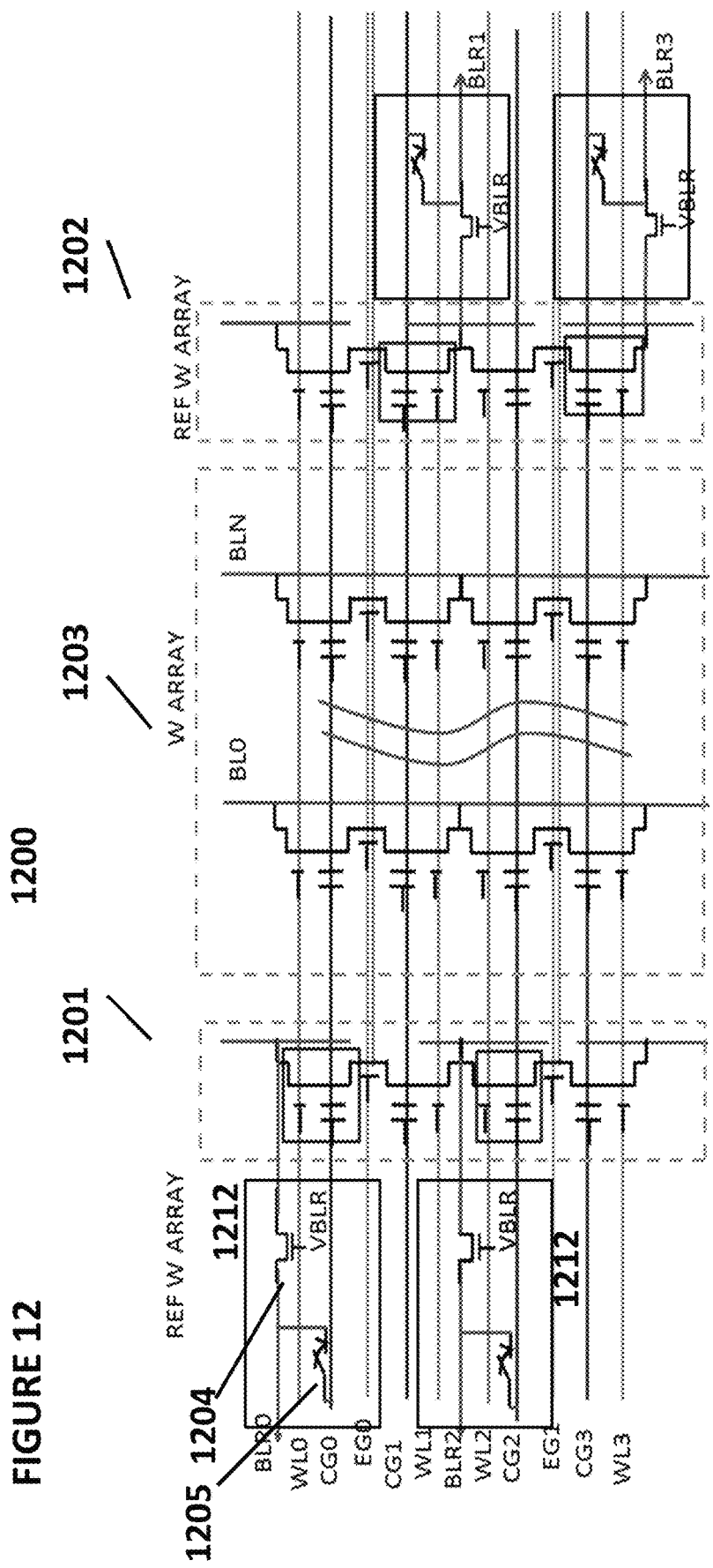
FIG. 12 depicts another embodiment of a vector-by-matrix multiplication system.
Figure 13:
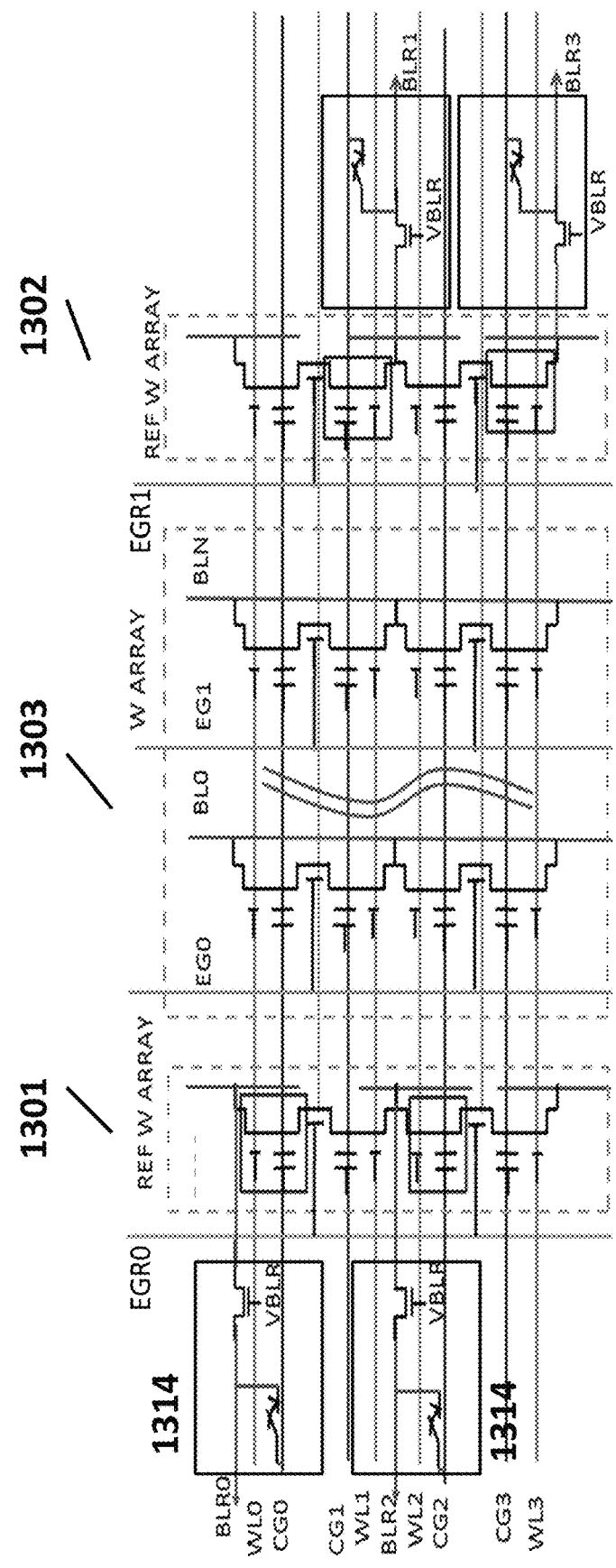
FIG. 13 depicts another embodiment of a vector-by-matrix multiplication system.
Figure 14:
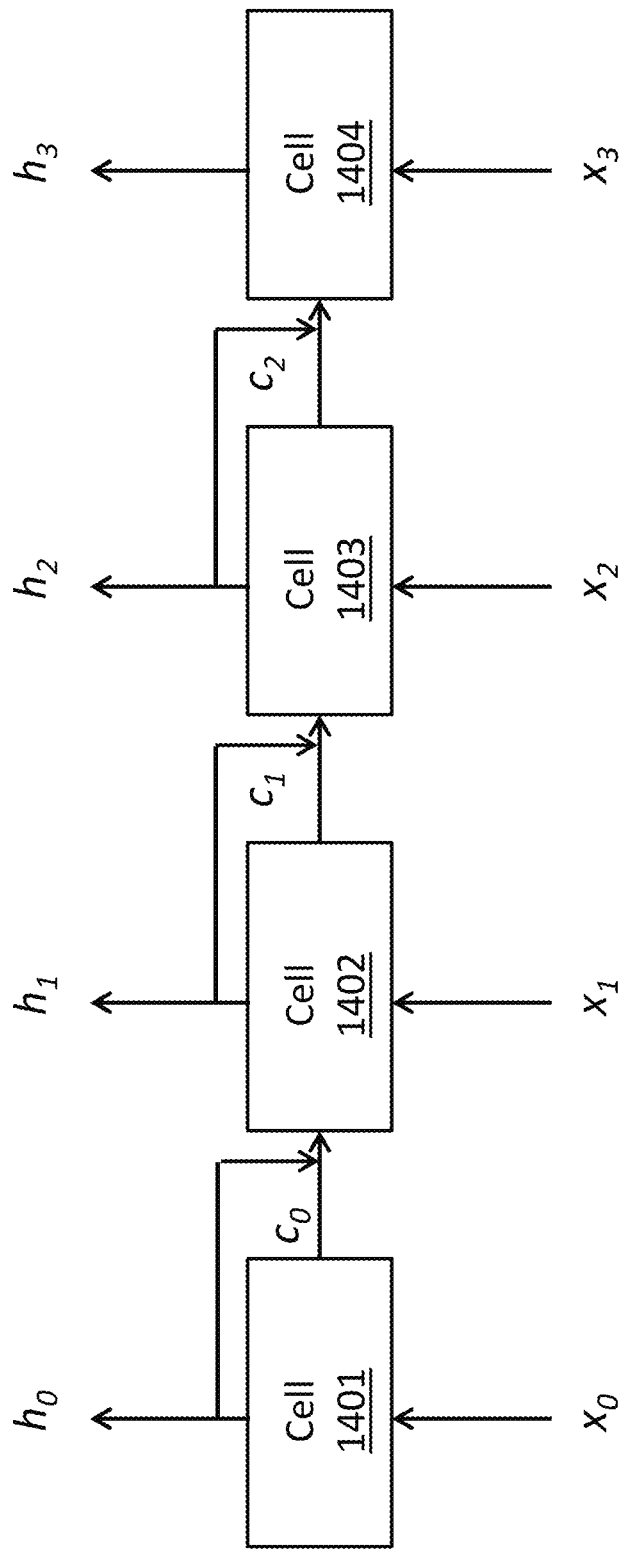
FIG. 14 depicts a prior art long short-term memory system.
Figure 15:
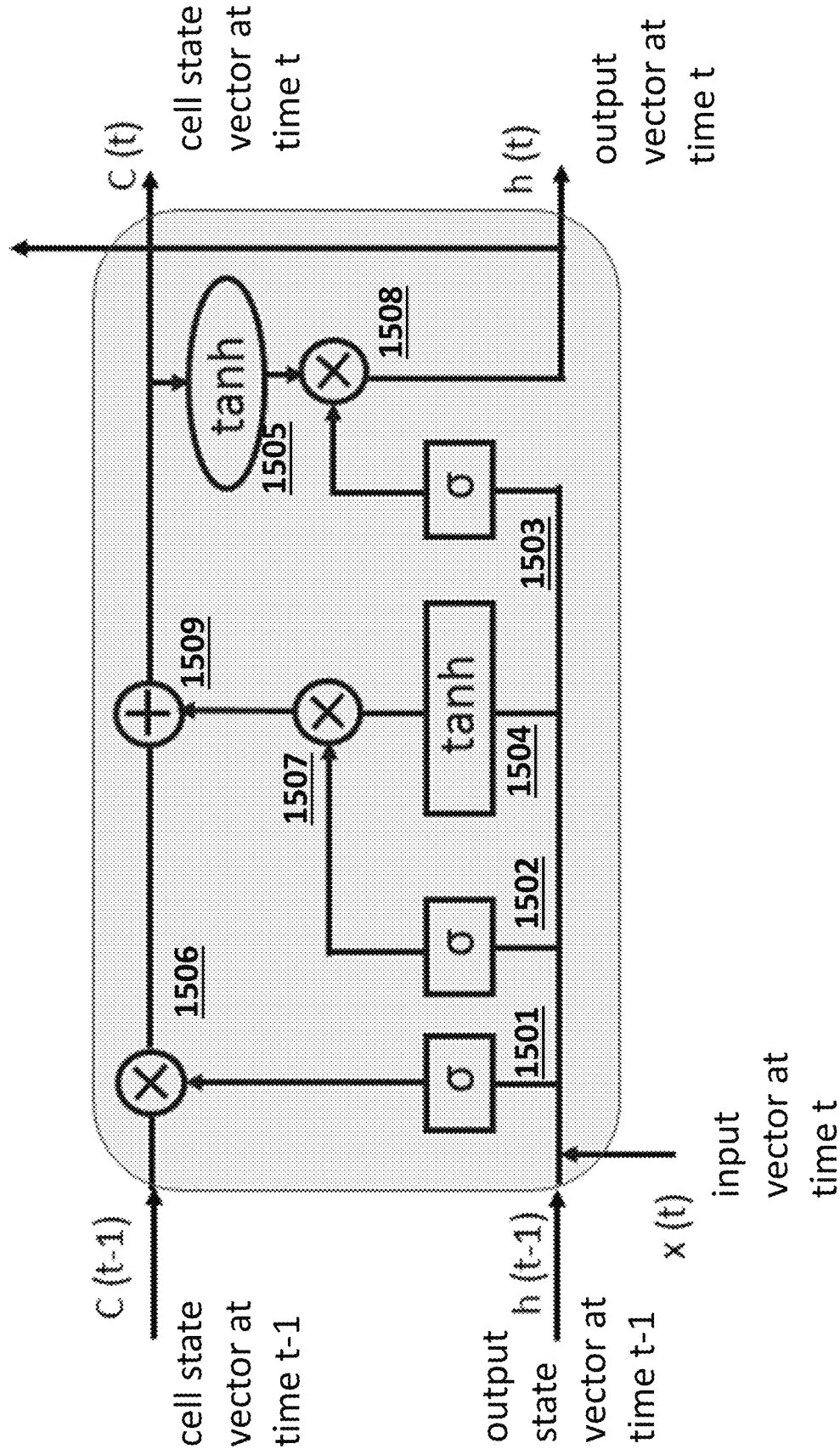
FIG. 15 depicts an exemplary cell for use in a long short-term memory system.
Figure 16:
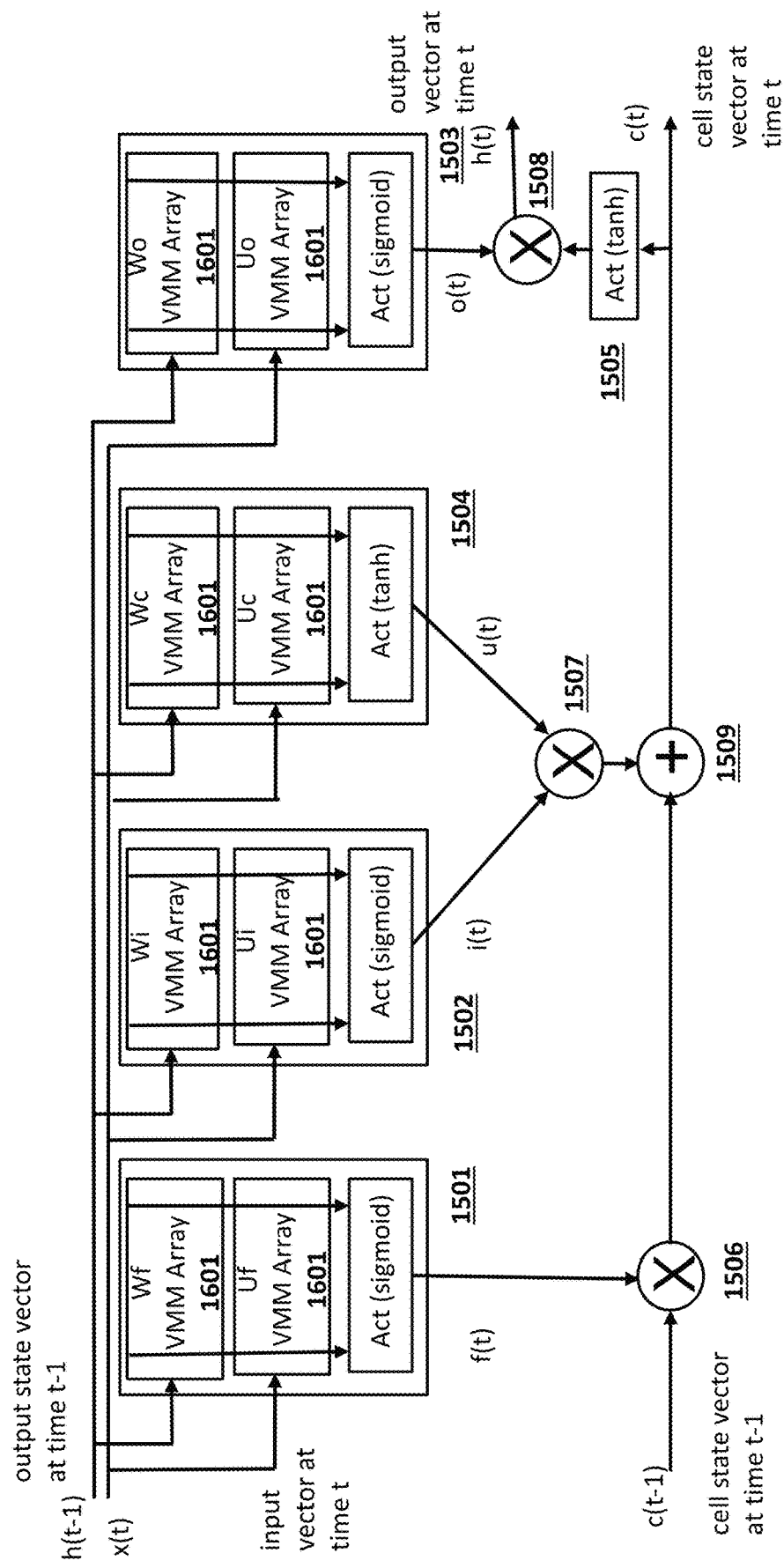
FIG. 16 depicts an embodiment of the exemplary cell of FIG. 15.
Figure 18:
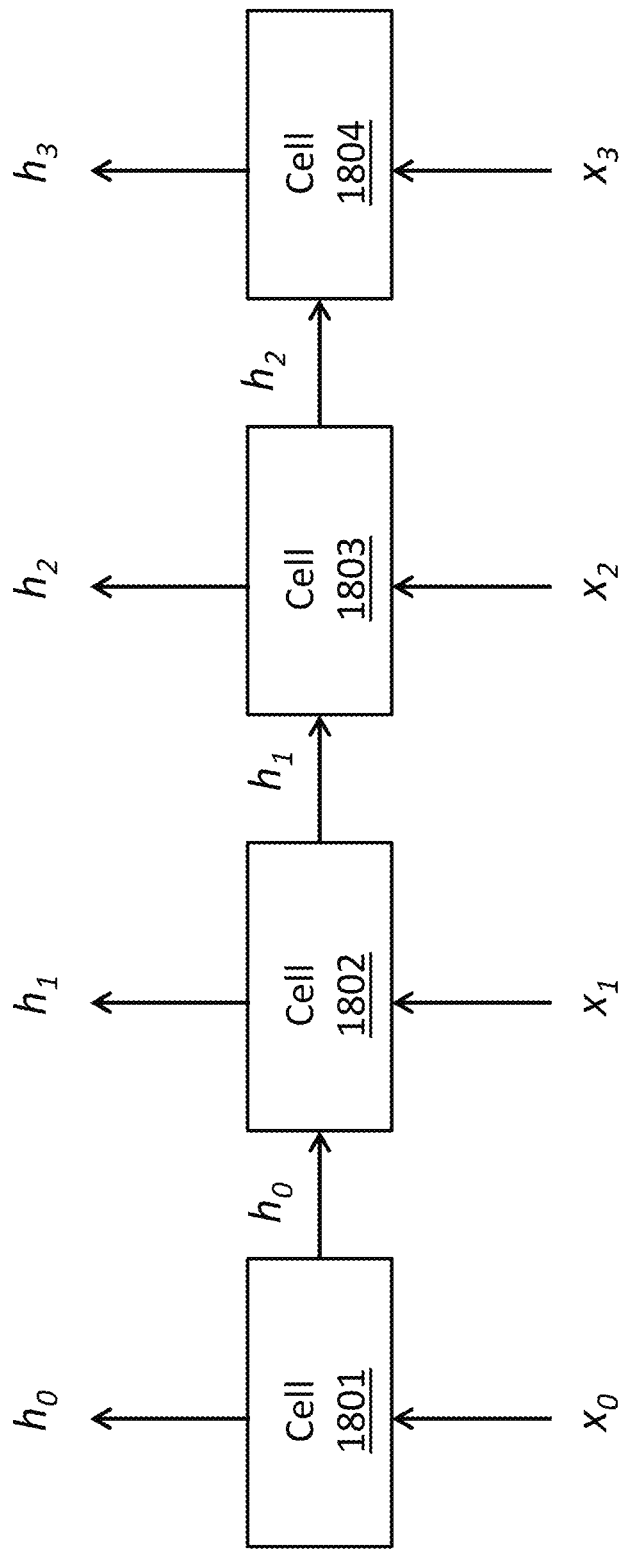
FIG. 18 depicts a prior art gated recurrent unit system.
Figure 19:
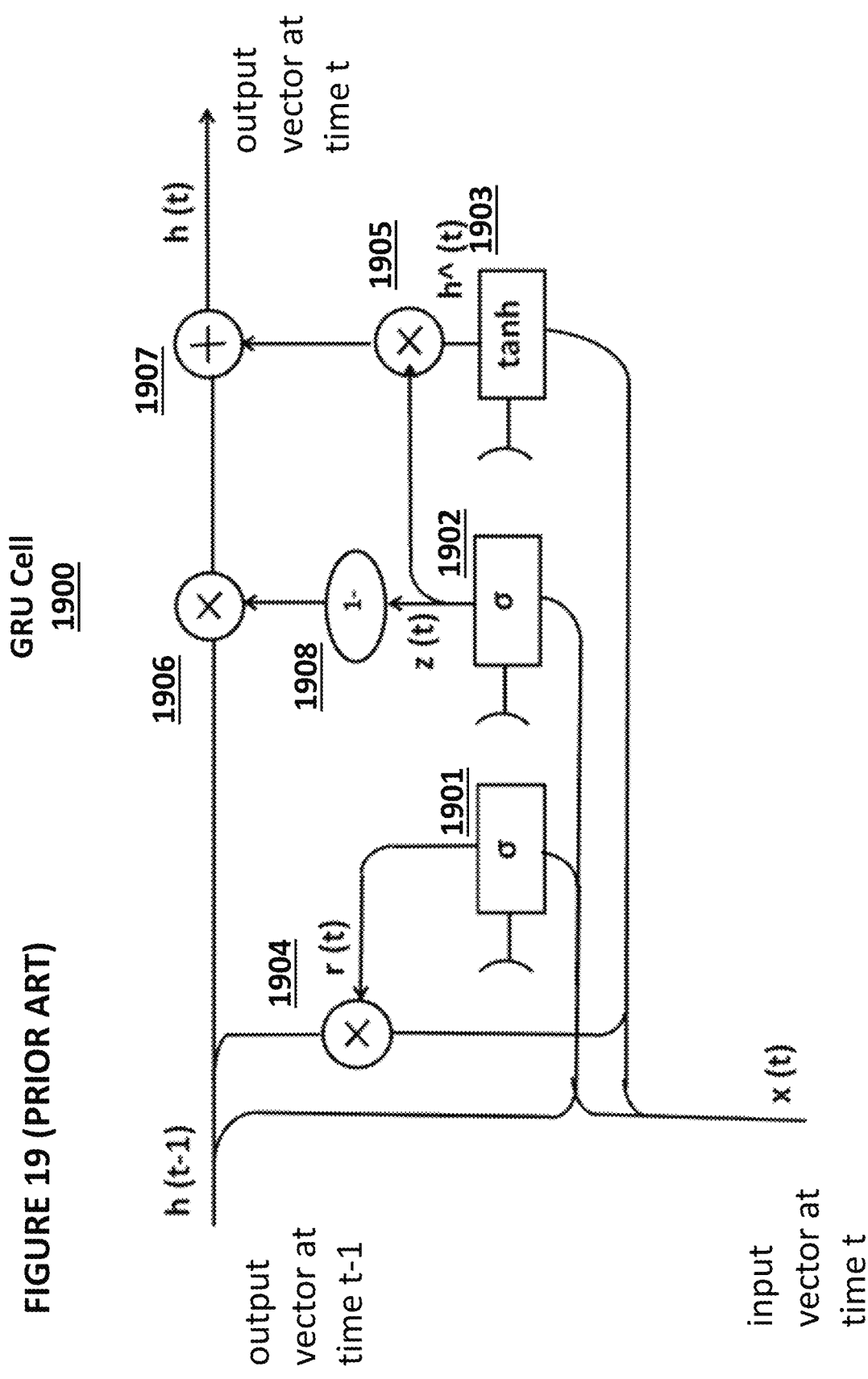
FIG. 19 depicts an exemplary cell for use in a gated recurrent unit system.
Figure 20:
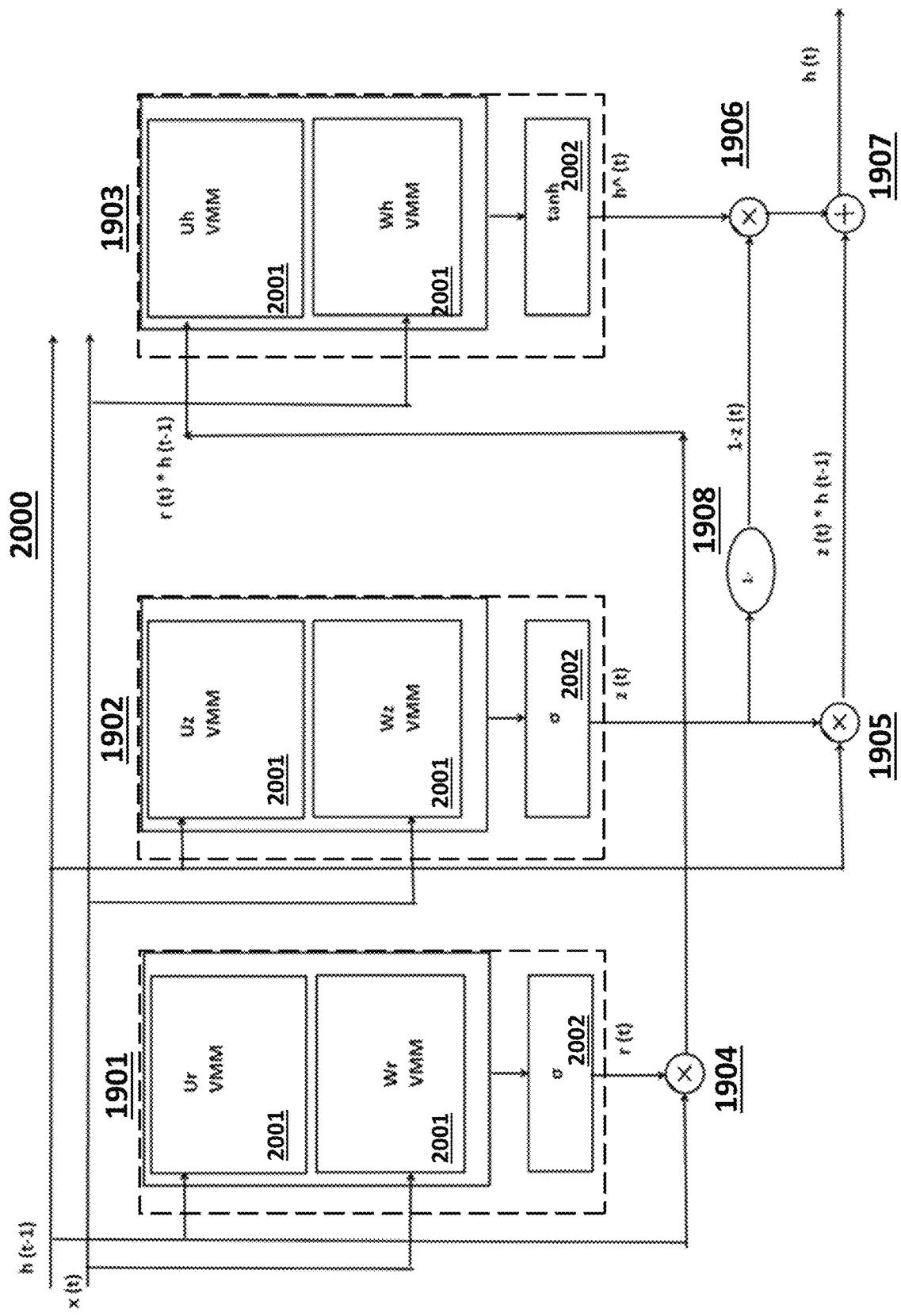
FIG. 20 depicts an embodiment of the exemplary cell of FIG. 19.
Figure 21:
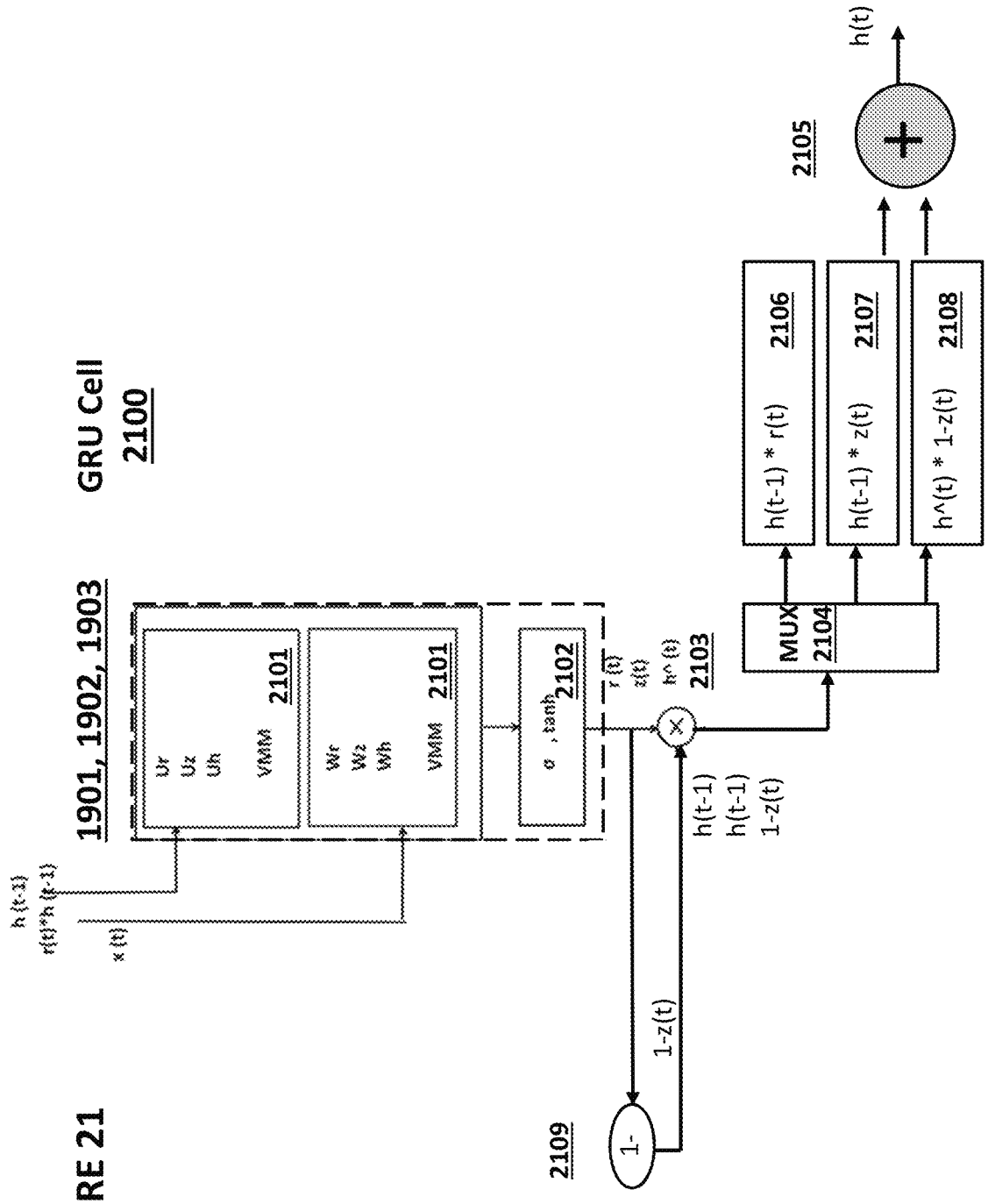
FIG. 21 depicts another embodiment of the exemplary cell of FIG. 19.
Figure 22:
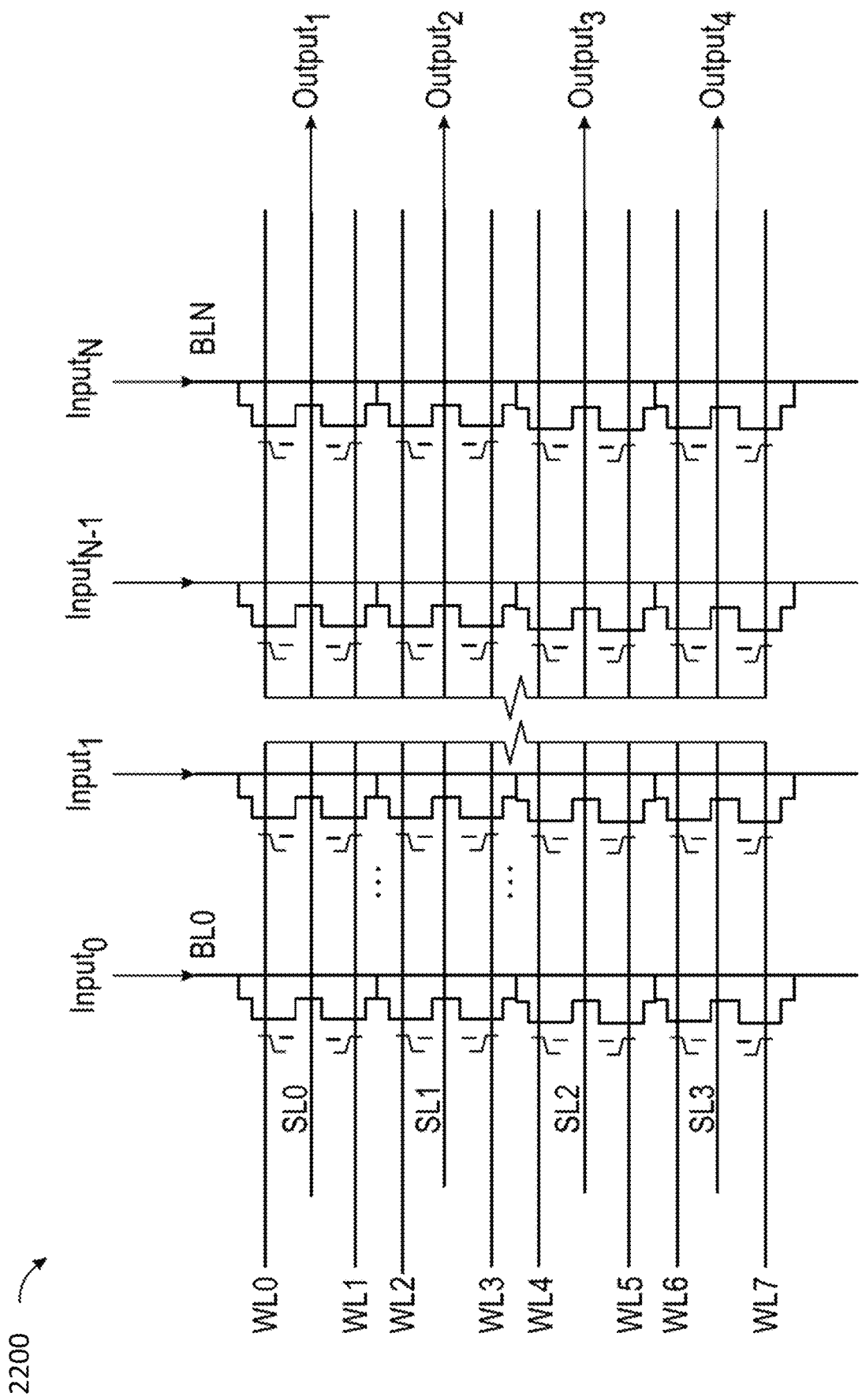
FIG. 22 depicts another embodiment of a vector-by-matrix multiplication system.
Figure 23:
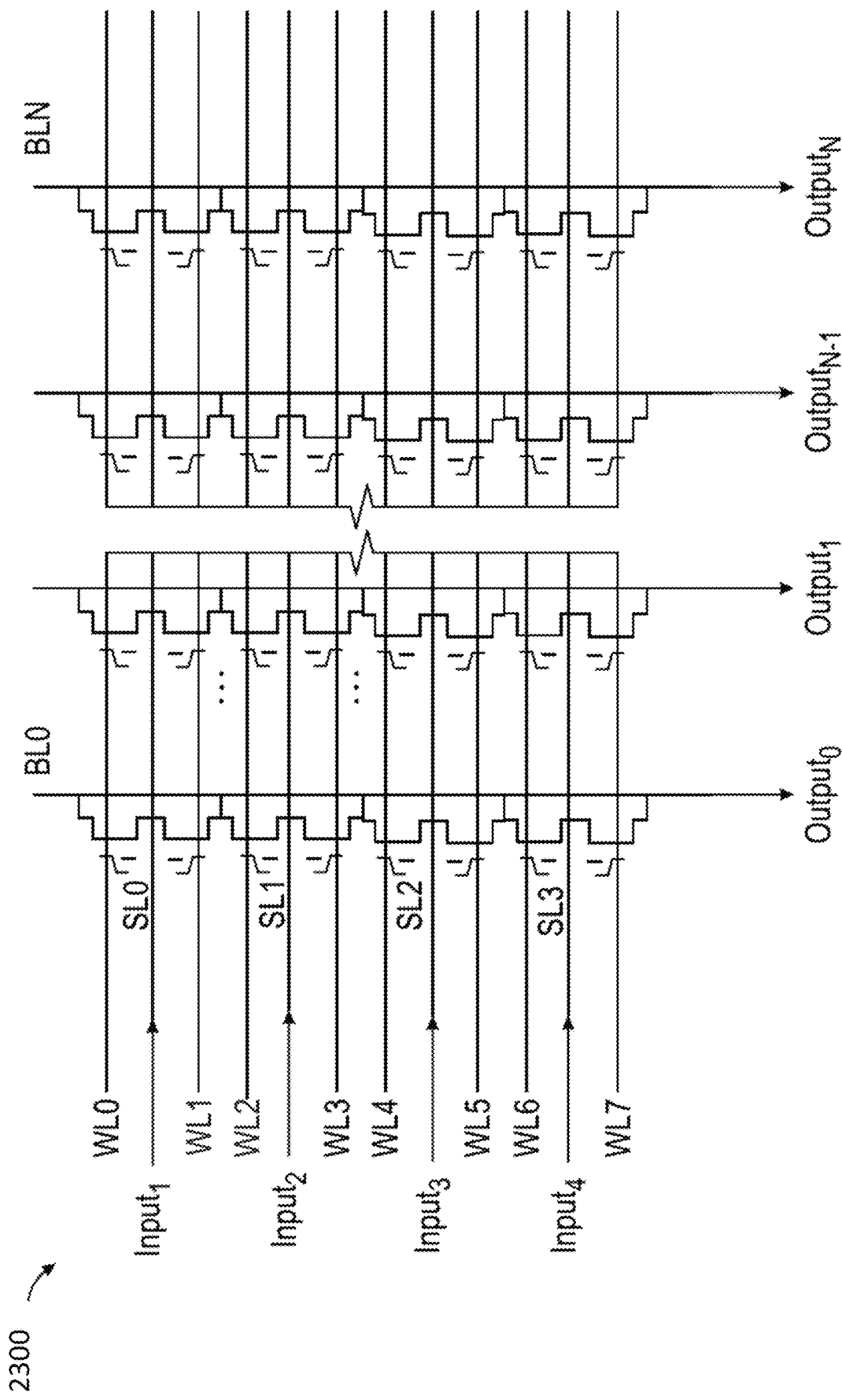
FIG. 23 depicts another embodiment of a vector-by-matrix multiplication system.
Figure 24:
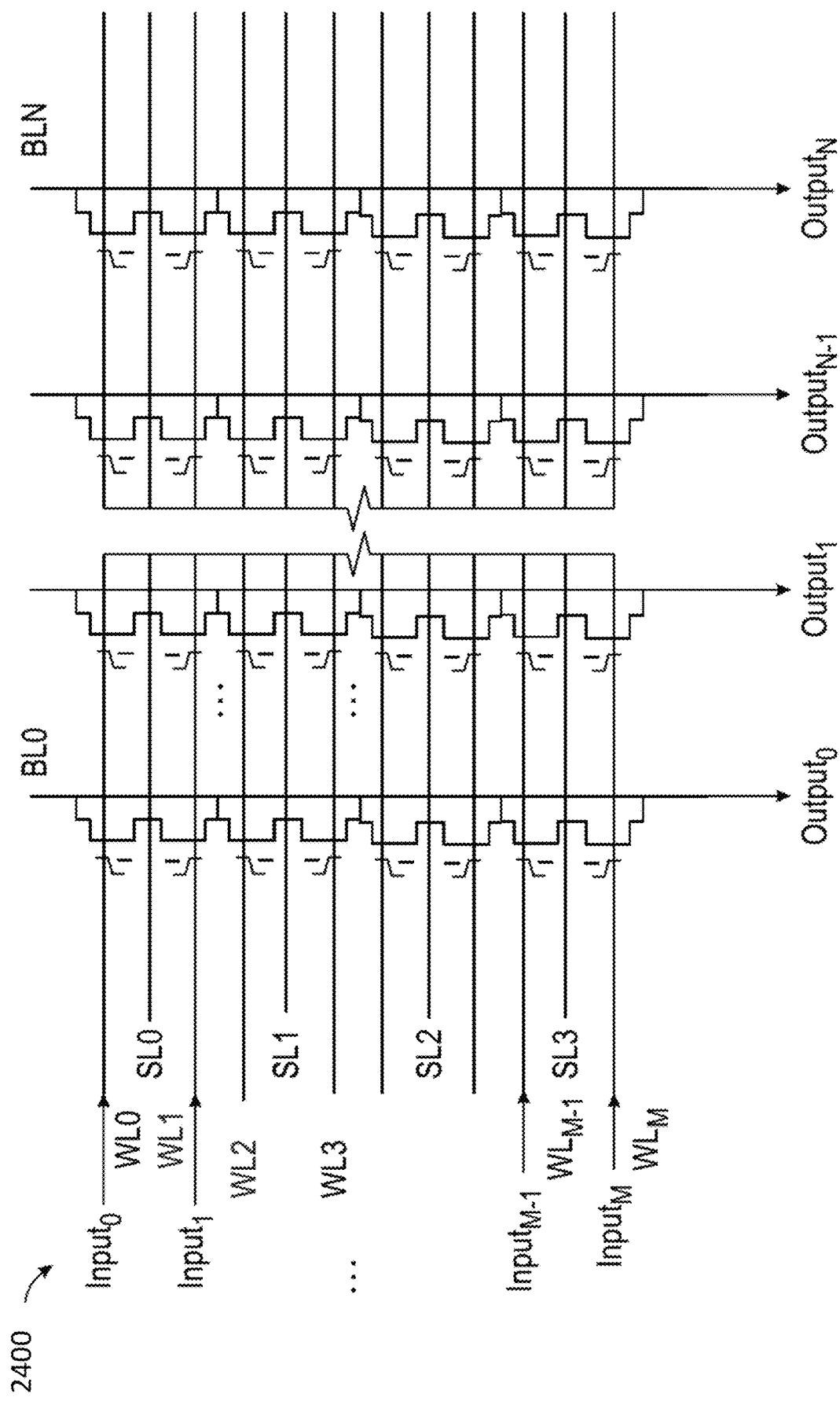
FIG. 24 depicts another embodiment of a vector-by-matrix multiplication system.
Figure 25:
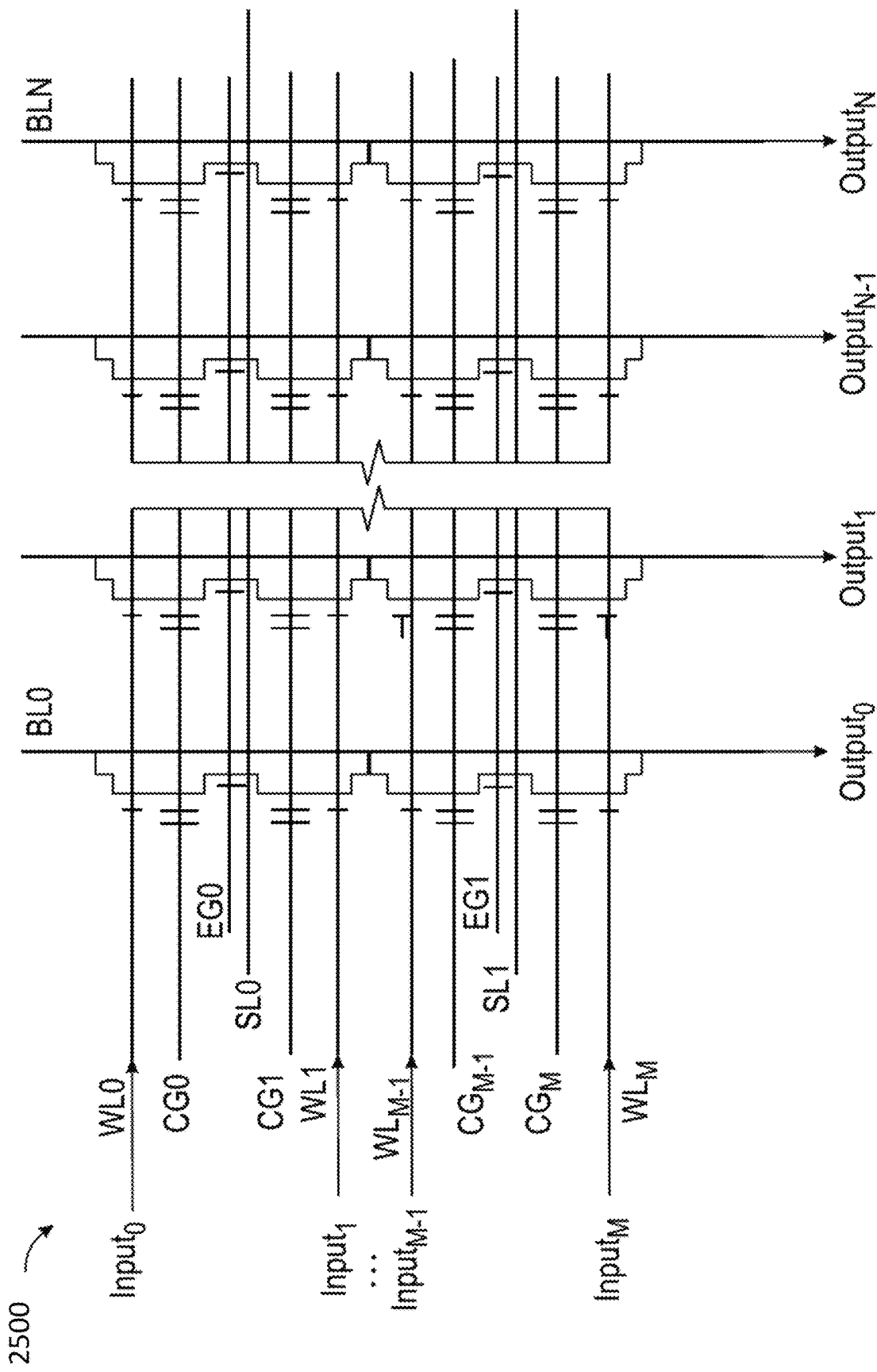
FIG. 25 depicts another embodiment of a vector-by-matrix multiplication system.
Figure 26:
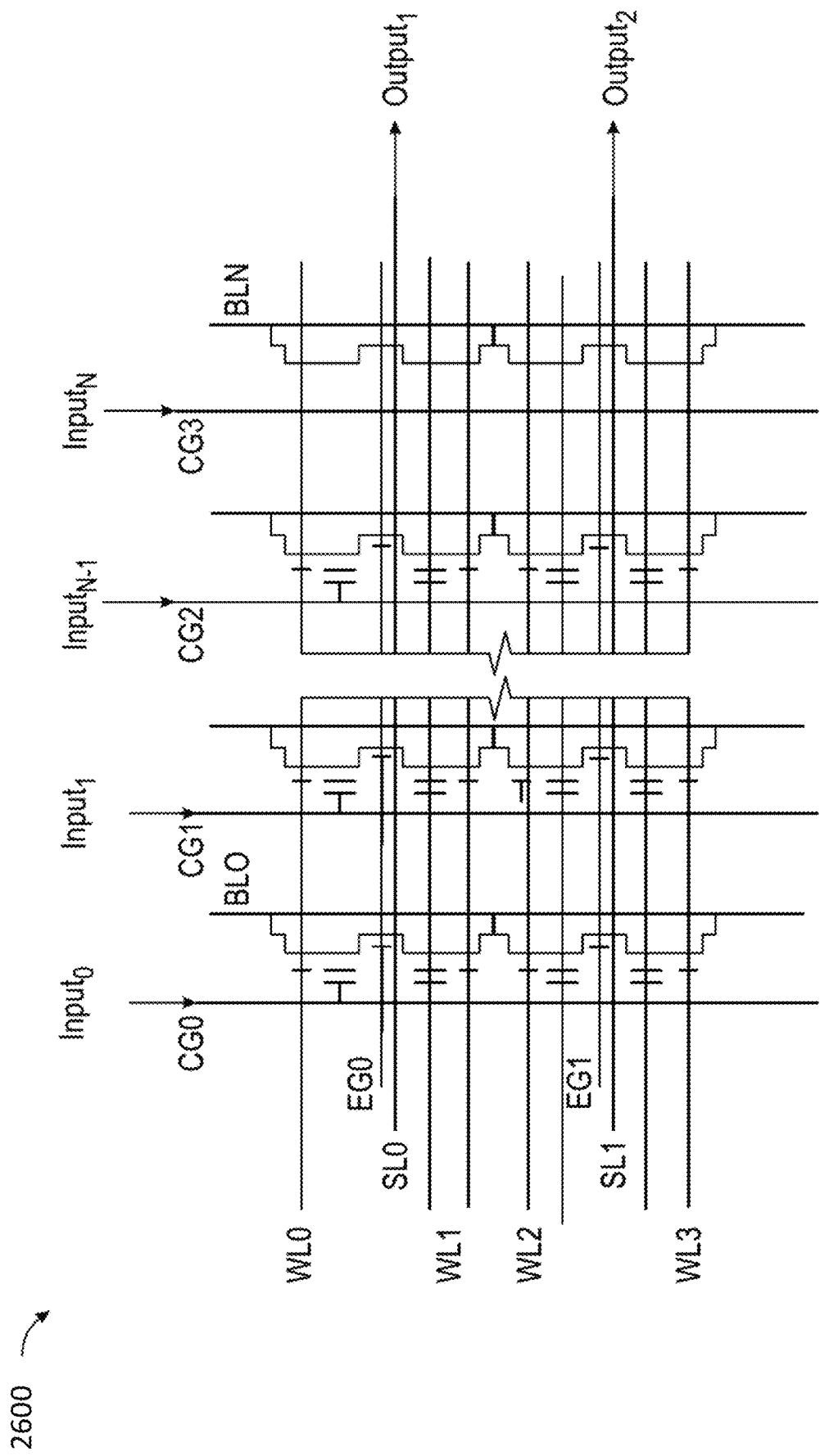
FIG. 26 depicts another embodiment of a vector-by-matrix multiplication system.
Figure 27:
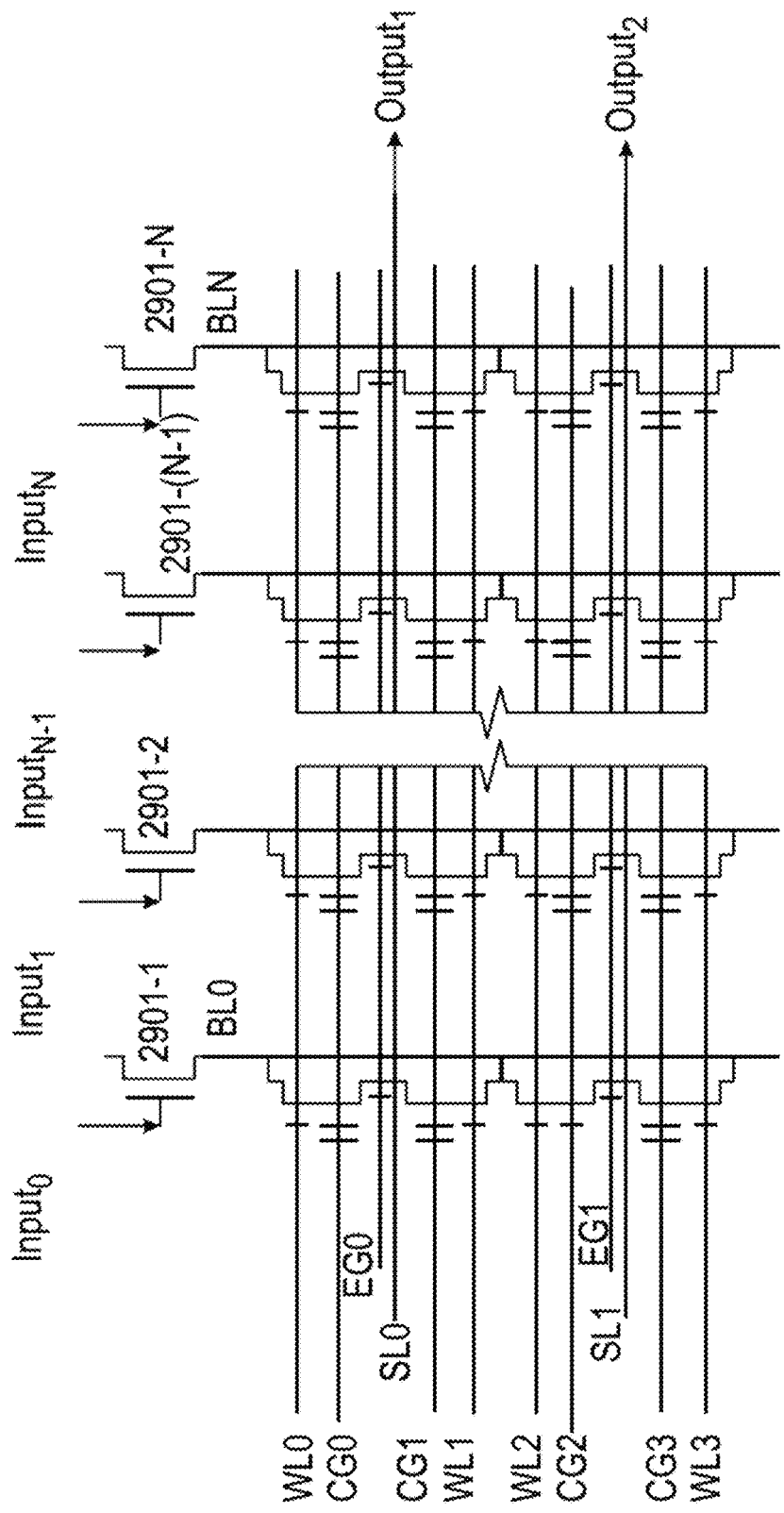
FIG. 27 depicts another embodiment of a vector-by-matrix multiplication system.
Figure 28:
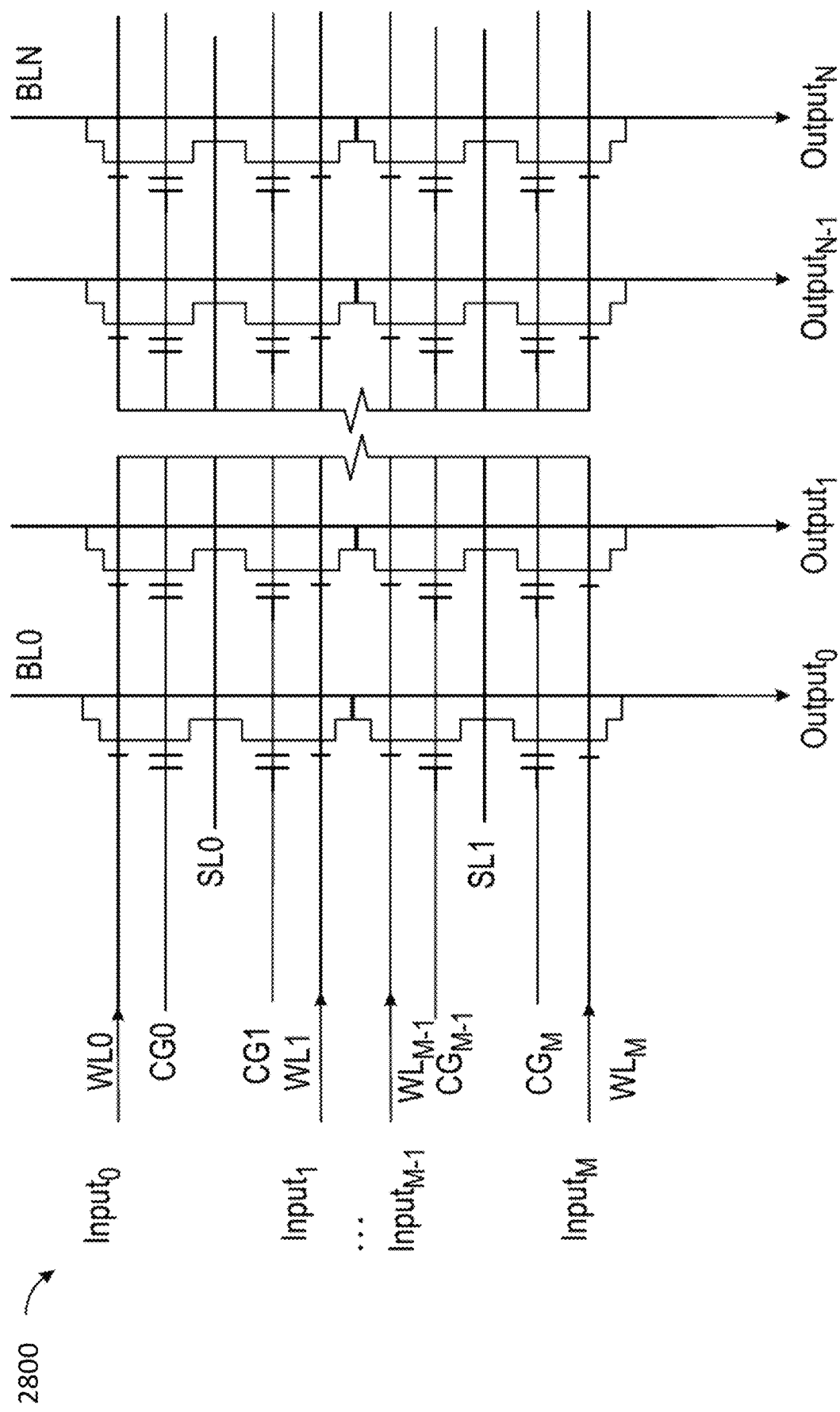
FIG. 28 depicts another embodiment of a vector-by-matrix multiplication system.
Figure 29:
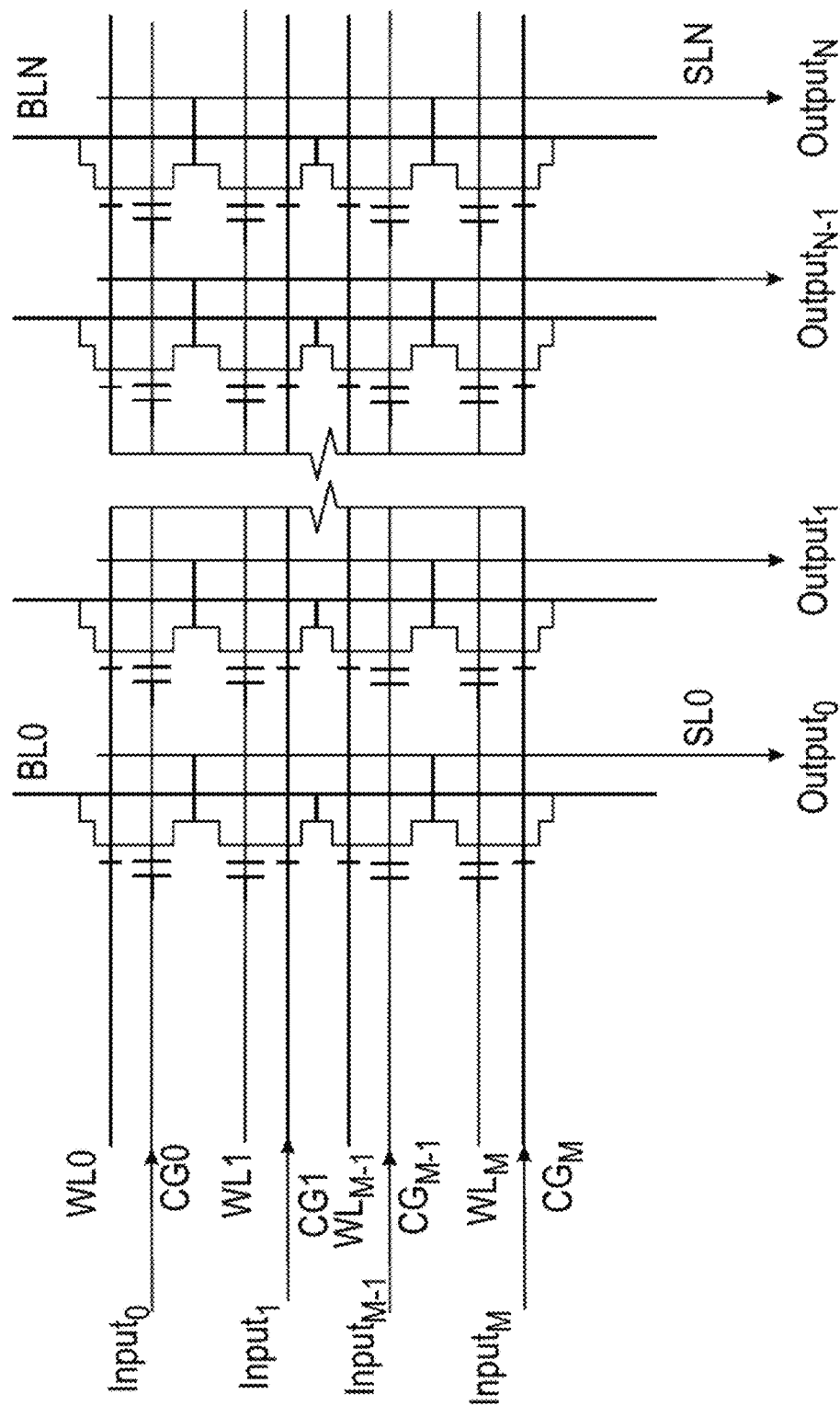
FIG. 29 depicts another embodiment of a vector-by-matrix multiplication system.
Figure 30:
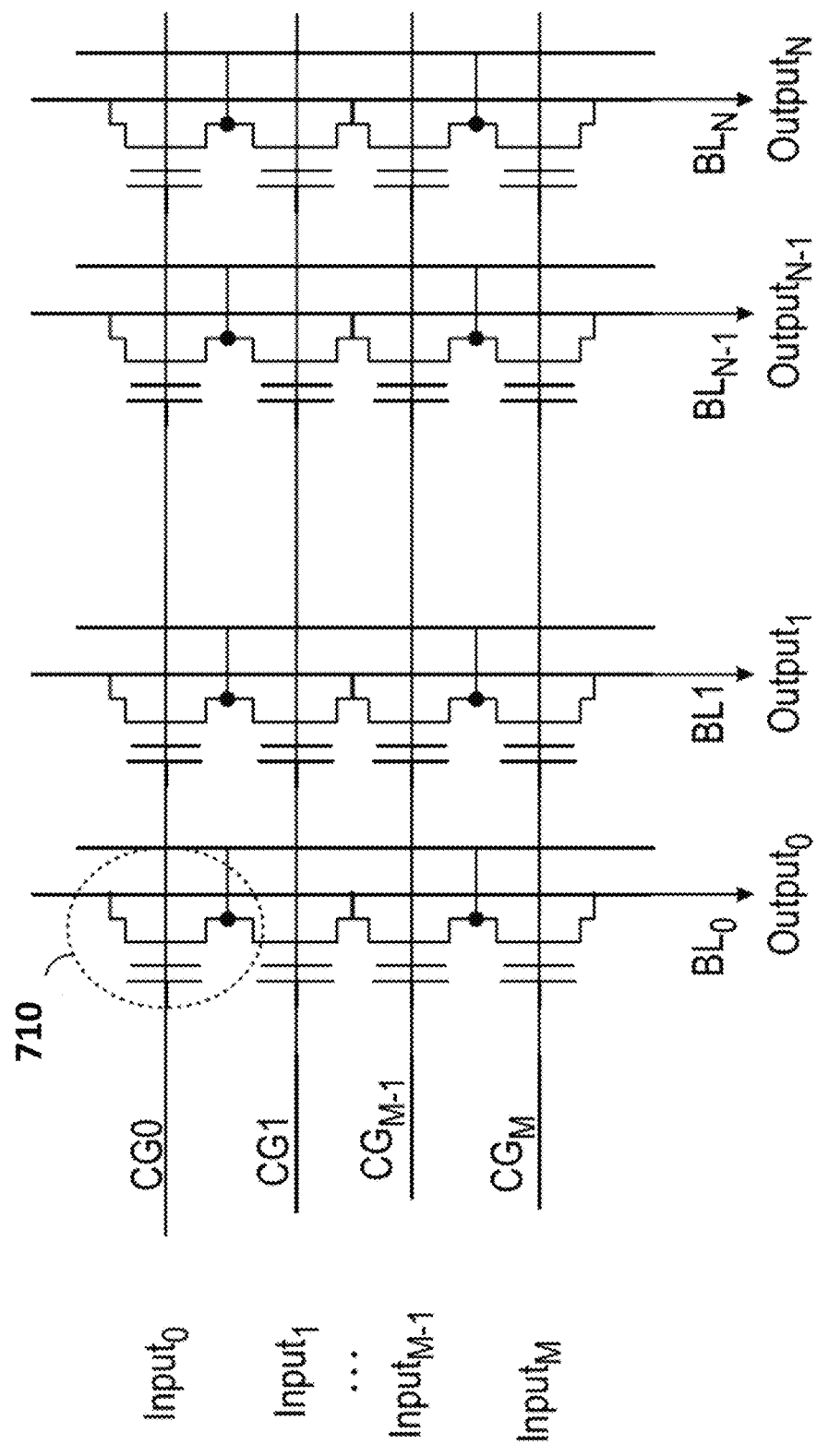
FIG. 30 depicts another embodiment of a vector-by-matrix multiplication system.
Figure 31:
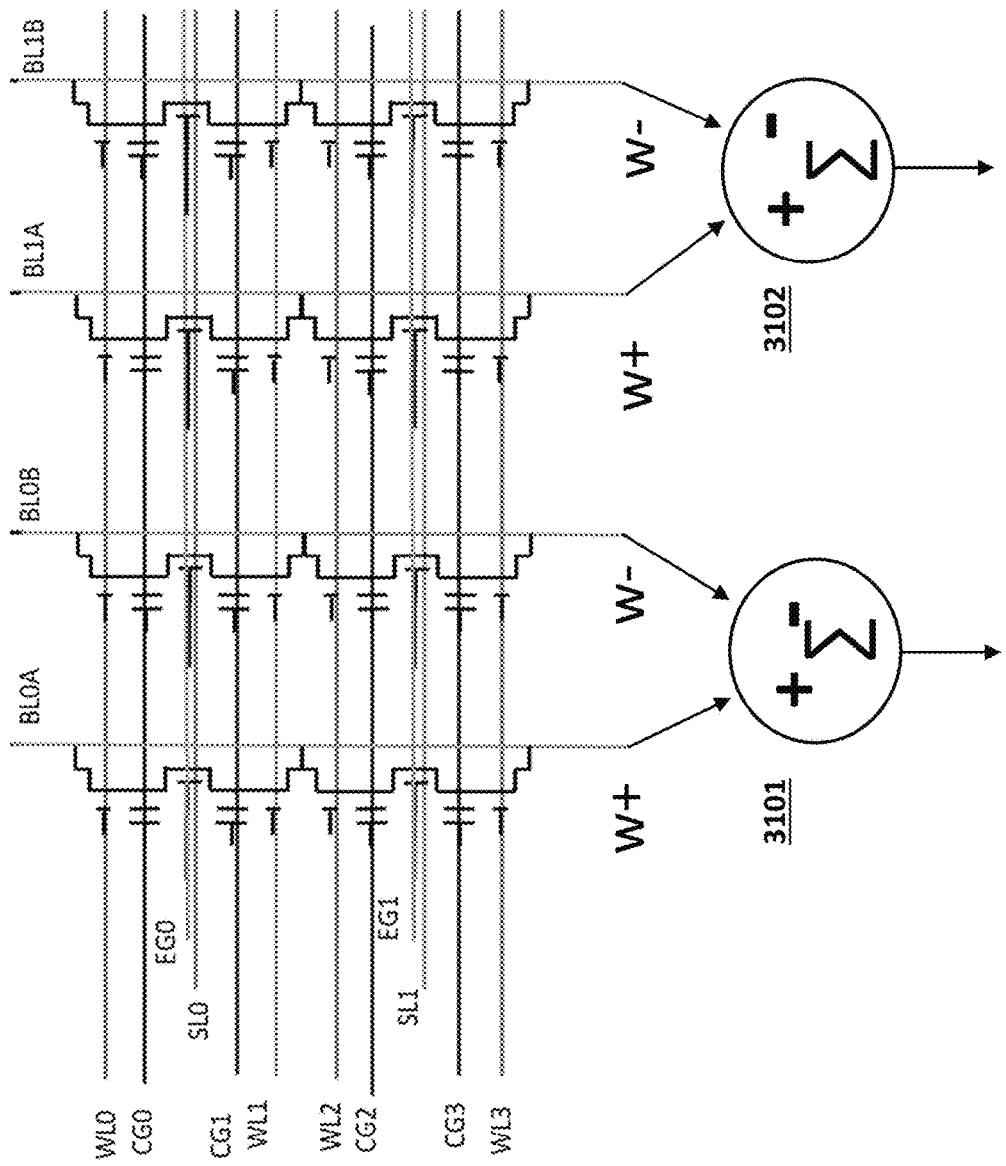
FIG. 31 depicts another embodiment of a vector-by-matrix multiplication system.
Figure 33:
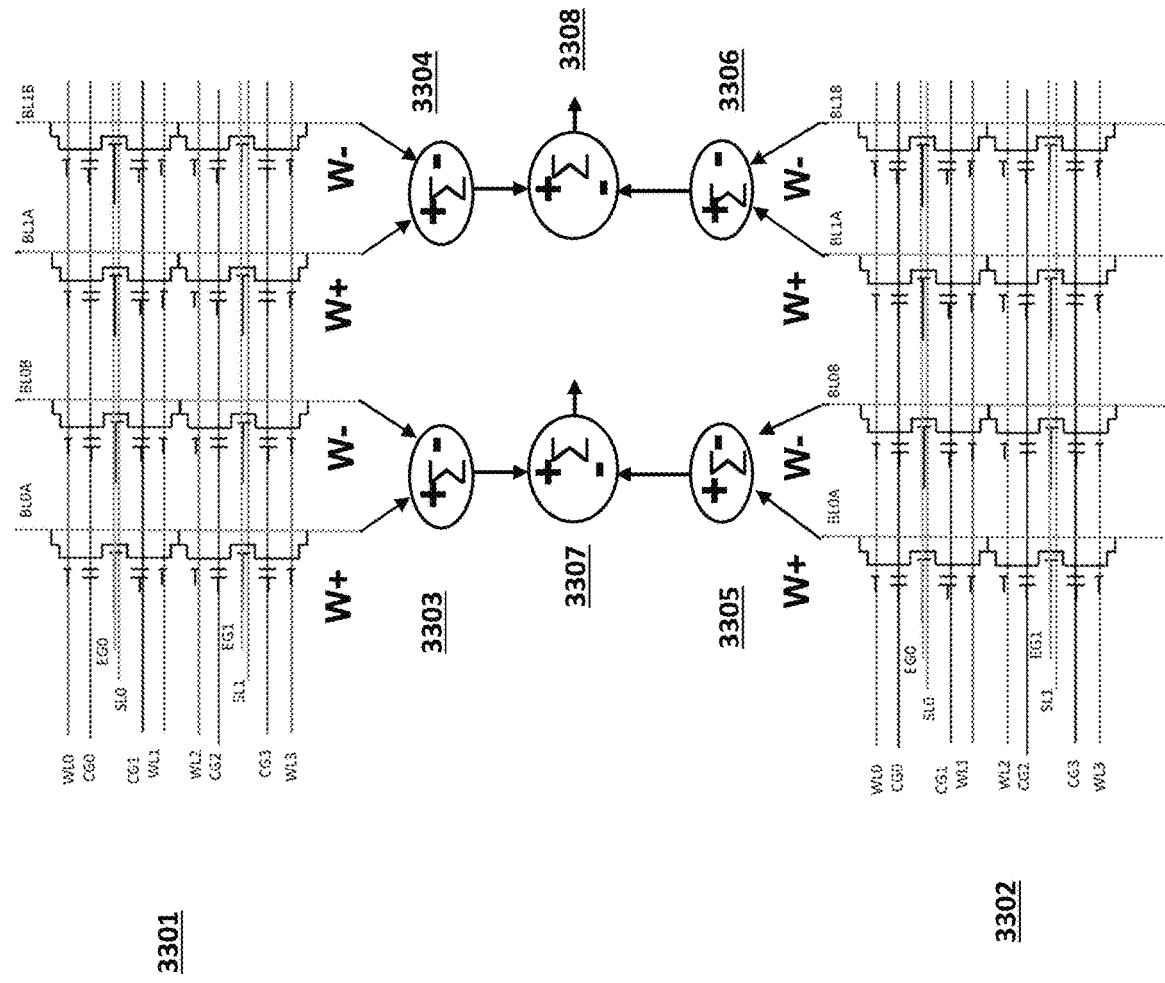
FIG. 33 depicts another embodiment of a vector-by-matrix multiplication system.
Figure 34:
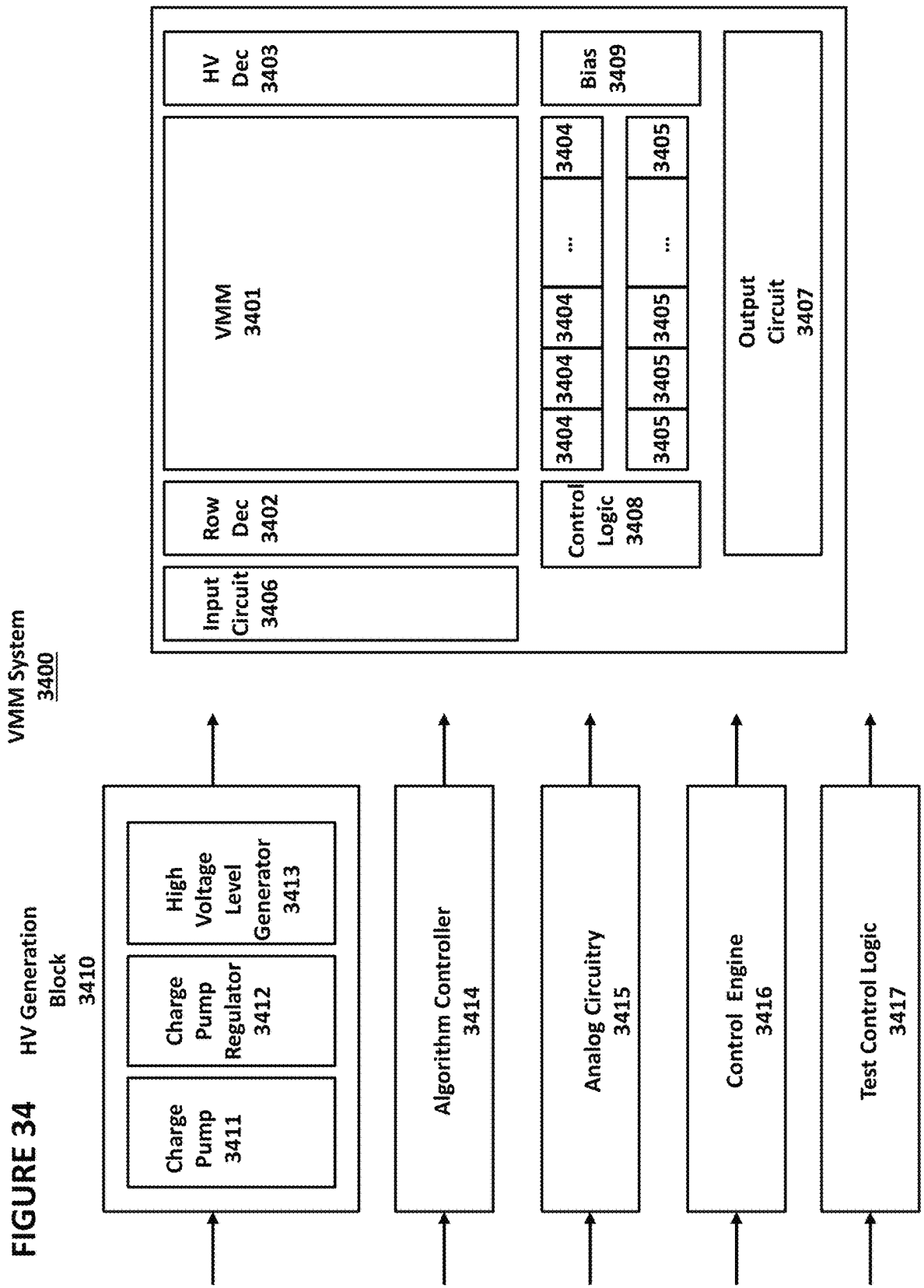
FIG. 34 depicts another embodiment of a vector-by-matrix multiplication system.

FIG. 34 depicts a block diagram of VMM system 3400. VMM system 3400 comprises VMM array 3401, row decoder 3402, high voltage decoder 3403, column decoder 3404, bit line drivers 3405, input circuit 3406, output circuit 3407, control logic 3408, and bias generator 3409. VMM system 3400 further comprises high voltage generation block 3410, which comprises charge pump 3411, charge pump regulator 3412, and high voltage analog precision level generator 3413. VMM system 3400 further comprises (program/erase, or weight tuning) algorithm controller 3414, analog circuitry 3415, control engine 3416 (that may include special functions such as arithmetic functions, activation functions, embedded microcontroller logic, without limitation), and test control logic 3417. The systems and methods described below can be implemented in VMM system 3400.

Input circuit 3406 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 3406 may implement normalization, linear or non-linear up/down scaling functions, or arithmetic functions. The input circuit 3406 may implement a temperature compensation function for input levels. The input circuit 3406 may implement an activation function such as ReLU or sigmoid. The output circuit 3407 may include circuits such as a ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters.

Output circuit 3407 may implement an activation function such as rectified linear activation function (ReLU) or sigmoid. The output circuit 3407 may implement statistic normalization, regularization, up/down scaling/gain functions, statistical rounding, or arithmetic functions (e.g., add, subtract, divide, multiply, shift, log) for neuron outputs. Output circuit 3407 may implement a temperature compensation function for neuron outputs or array outputs (such as bitline output) so as to keep power consumption of the array approximately constant or to improve precision of the array (neuron) outputs such as by keeping the IV slope approximately the same.

Figure 35:
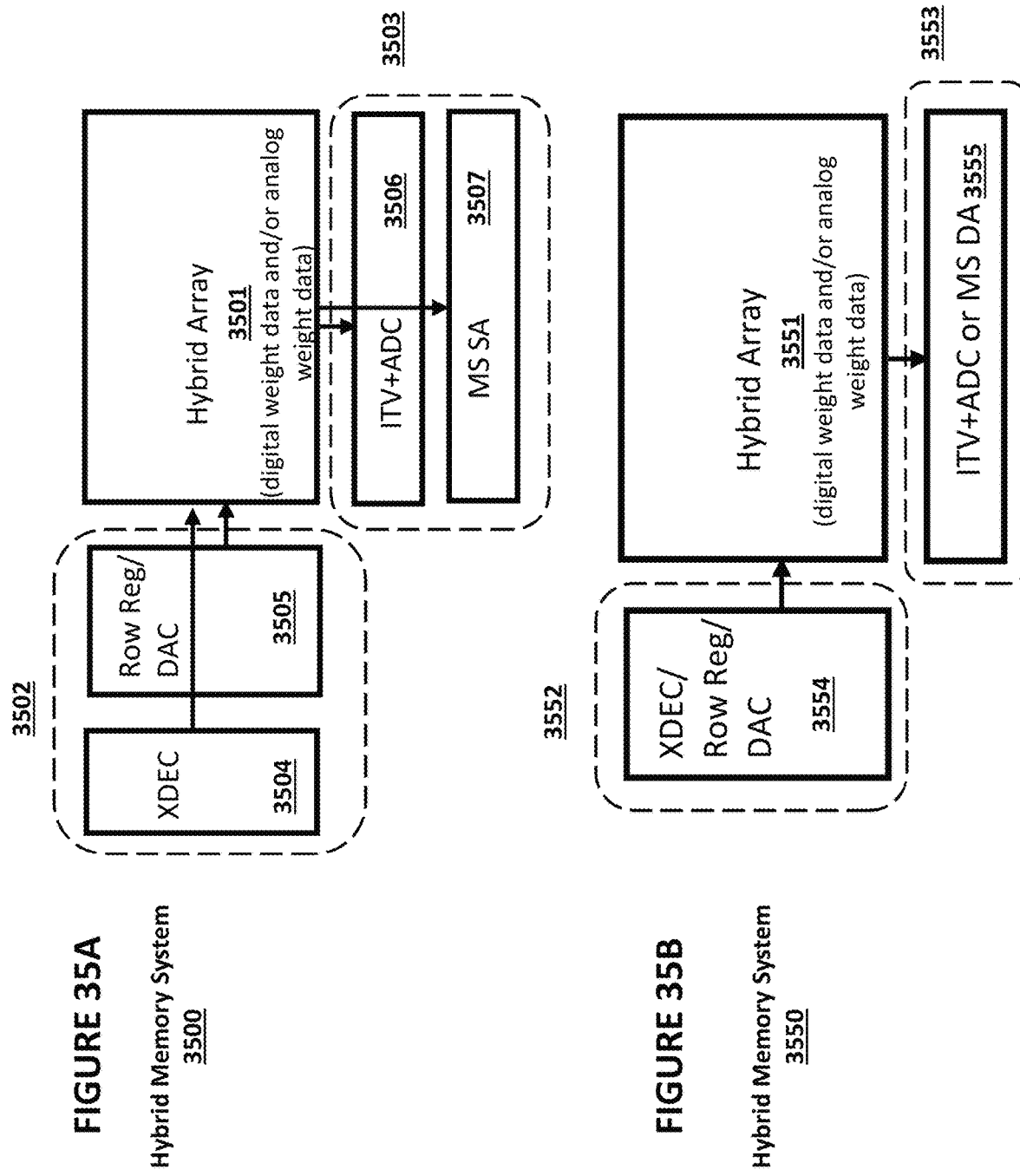
FIG. 35A depicts a hybrid memory system.
FIG. 35B depicts another hybrid memory system.

FIGS. 35A and 35B depict hybrid memory systems 3500 and 3550, respectively. Hybrid memory systems 3500 and 3550 each is capable of operating as a multi-level digital neural memory system to obtain digital weight data from the array in a first mode or as a multi-level analog neural memory system to obtain analog weight data from the array in a second mode.

In FIG. 35A, hybrid memory system 3500 comprises hybrid array 3501 comprising an array of non-volatile memory cells arranged into rows and columns; configurable input circuitry 3502; and configurable output circuitry 3503.

Configurable input circuitry 3502 provides an input to hybrid array 3501 and comprises row register and digital-to-analog (DAC) block 3505 for use in the first mode and row decoder block 3504 for use in the second mode.

Configurable output circuitry 3503 provides an output responsive to signals received from hybrid array 3501 and comprises current-to-voltage converter (ITV) and analog-to-digital converter (ADC) block 3506 for use in the first mode and multi-state sense amplifier (MS SA) block 3507 for use in the second mode. The ITV+ADC block 3506 comprises multiple ITV circuits and multiple ADC circuits. The MS SA block 3507 comprises multiple MS SA circuits.

In the first mode, hybrid array 3501 operates as a non-volatile memory storage to store or retrieve weight data in multi-bit digital form (digital multilevel form, meaning one physical memory cell can store one of multiple discrete levels such as 4 or 8 or 16 or 32 levels, meaning an output of one cell would equivalent to 2 digital bits or 3 digital bits or 4 digital bits or 5 digital bits, respectively). For example, if each cell can store 8 different values (3 bit or 3b cell), the digital weight data can vary from 000 to 111. As another example, if each cell can store 2 different values, as in a binary memory cell (1 bit cell), the digital weight data can vary from 0 to 1.

In the first mode, row register and digital-to-analog (DAC) block 3505 generates an analog input signal to read one or more rows in hybrid array 3501 in response to a received digital signal. Digital MLC (multilevel cell) read mode only reads one row at a time, neural read mode reads more than one row at a time typically tens or hundreds of rows at a time. Block ITV+ADC 3506 receives analog (current) outputs from a plurality or all of columns of hybrid array 3501 to generate digital outputs representing a neural read of the majority (reading multiple rows and multiple columns at a time) of the entire hybrid array 3501. One ITV circuit is used to read one bitline at time to output analog value, which could include multiple cells on the same bitline. The ITV is used typically to convert the array output current into a voltage. One ADC circuit is used typically to read one bitline at a time to output digital bits, which could include multiple cells on the same bitline. The ADC circuit is typically used to convert a voltage into digital output bits. In one embodiment the ADC circuit can be used to convert the array current into digital output bits directly. For example, for a SAR ADC using voltage references, it can instead use current references for the operation.

In the second mode, hybrid array 3501 operates as a VMM in an analog neural memory to store weight data in analog multi-level form, meaning each cell stores analog multilevels that has continuous analog values between levels. For example, for a digital multi-level cell of 8 levels, the cell has distinct levels from 1, 2, 3, 4, . . . , 8. For an analog multi-level cell of 8 levels, the cell has continuous value between levels, for example between level of 1 and 2, there exists analog values of 1.001, 1.002, . . . , 1.01, . . . 1.1, 1.2, . . . , 1.999, 2.0. The analog multi levels are needed for vector matrix multiplier (VMM) applications for neural array memory application.

In the second mode, row decoder block 3504 is used to select (enable) one row in hybrid array 3501 for a read, program, or erase operation. During a read or program operation, MS SA block 3507 is used to read or verify one or more cells in one or more columns in hybrid array 3501. One MS SA circuit is used to read one cell at a time.

Thus, hybrid memory system 3500 can operate as a multi-level digital neural memory system to obtain digital weight data from the array in a first mode or as a multi-level analog neural memory system to obtain analog weight data from the array in a second mode.

In FIG. 35B, hybrid memory system 3550 comprises hybrid array 3551 comprising an array of non-volatile memory cells arranged into rows and columns; configurable input circuitry 3552; and configurable output circuitry 3553.

Configurable input circuitry 3552 provides an input to hybrid array 3551 and comprises a row decoder, a row register, and a digital-to-analog block 3554. That is, blocks 3504 and 3505 of FIG. 35A are consolidated into a single block 3554. Configurable output circuitry 3503 provides an output responsive to signals received from hybrid array 3551 and comprises a current-to-voltage converter, an analog-to-digital converter, and a sense amplifier block 3555. That is, block 3506 and 3507 from FIG. 35A are consolidated into a single block 3555.

In a first mode, hybrid array 3551 operates as non-volatile memory storage to store weight data in multilevel digital form. Block 3554 generate an analog input signal to read one or more rows in hybrid array 3551 in response to a received digital signal. Block 3555 receives analog (current) outputs from some or all of the columns of hybrid array 3551 to generate a digital output representing a neural read of at least a majority of the cells in the hybrid array 3551.

In a second mode, hybrid array 3551 operates as a VMM in an analog neural memory to store weight data in multi-level analog form. Block 3554 is used to select one row in hybrid array 3501 for a read, program, or erase operation by acting as a row decoder. Block 3555 is used to read or verify one or more cells in one or more columns in hybrid array 3551 by acting as a multi-state sense amplifier. Each MS SA circuit operates on one cell at a time (i.e., one bitline with one cell enabled).

Thus, hybrid memory system 3550 can operate as a digital neural memory system to obtain digital weight data from hybrid array 3551 in a first mode or as an analog neural memory system to obtain analog weight data from hybrid array 3551 in a second mode.

Figure 36:
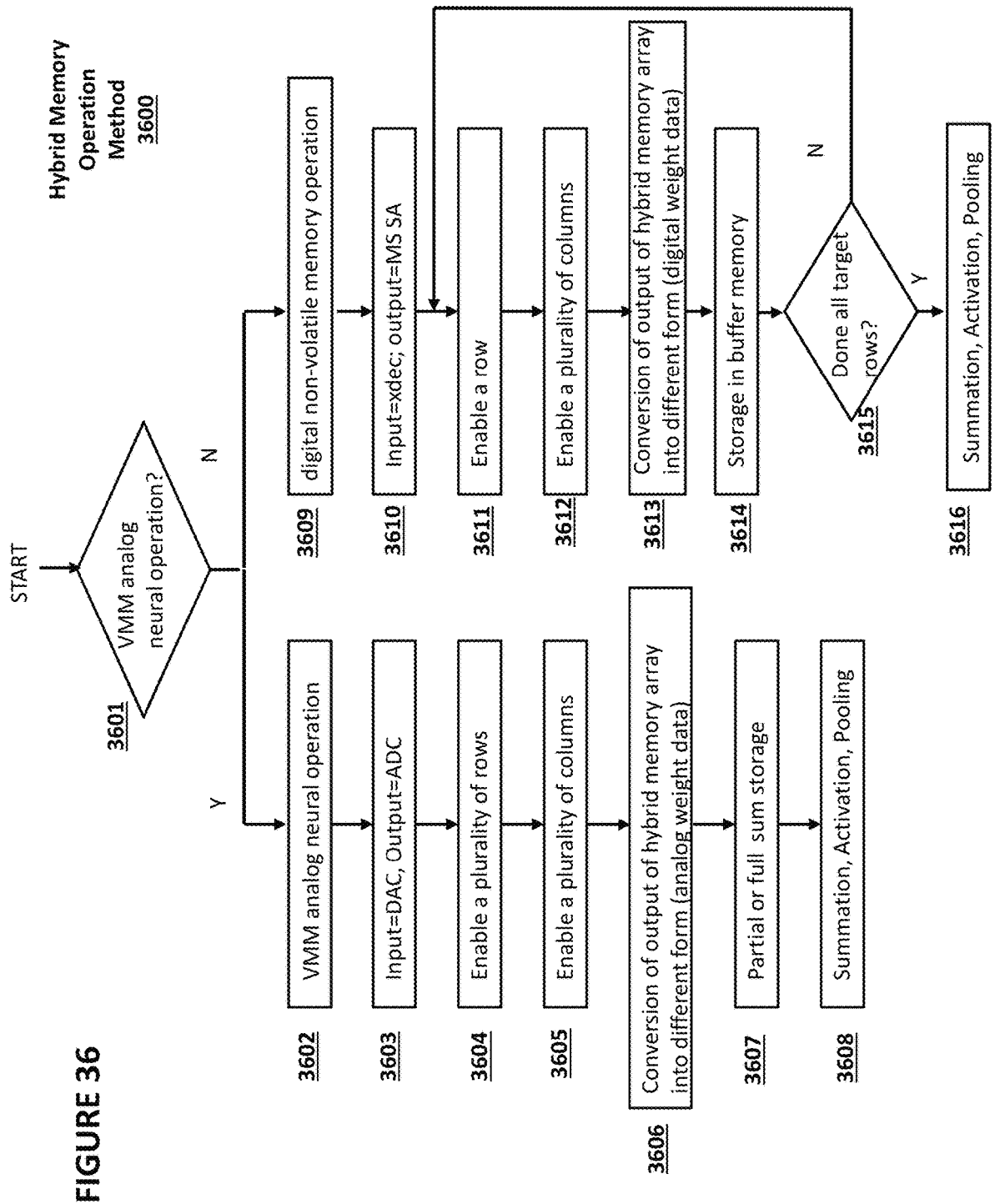
FIG. 36 depicts a hybrid memory operation method.

FIG. 36 depicts hybrid memory operation method 3600, which can be performed by hybrid memory system 3500 of FIG. 35A or hybrid memory system 3550 of FIG. 35B.

In step 3601, the system determines if a VMM analog neural memory operation is to be performed. If yes, the system proceeds to step 3602. If no, the system proceeds to step 3609.

In step 3602, a VMM analog neural operation begins. In step 3603, an input is provided by a digital-to-analog converter, and a resulting output is provided by an analog-to-digital converter. The DAC can be a 1-bit DAC.

In step 3604, a plurality of rows are enabled.

In step 3605, a plurality of columns are enabled.

In step 3606, an output from the hybrid memory array is converted into a different form such as digital output bits (analog weight data).

In step 3607, a partial sum storage is performed.

In step 3608, the actions of summation, activation, and/or pooling are performed to generate a neural output.

In step 3609, a digital non-volatile memory operation is to be performed.

In step 3610, an input is provided by a row decoder, and an output is provided by a multi-state sense amplifier.

In step 3611, a row is enabled.

In step 3612, a column is enabled.

In step 3613, an output from the hybrid memory array is converted into a different form such as digital output bits (digital weight data).

In step 3614, the output from step 3613 is stored in a buffer memory such as an SRAM memory.

In step 3615, the system determines if all target rows have been operated upon. If yes, the system proceeds to step 3616. If no, the system returns to step 3611 and performs the steps described above.

In step 3616, the actions of summation, activation, and/or pooling are performed to generate an output.

Figure 37:
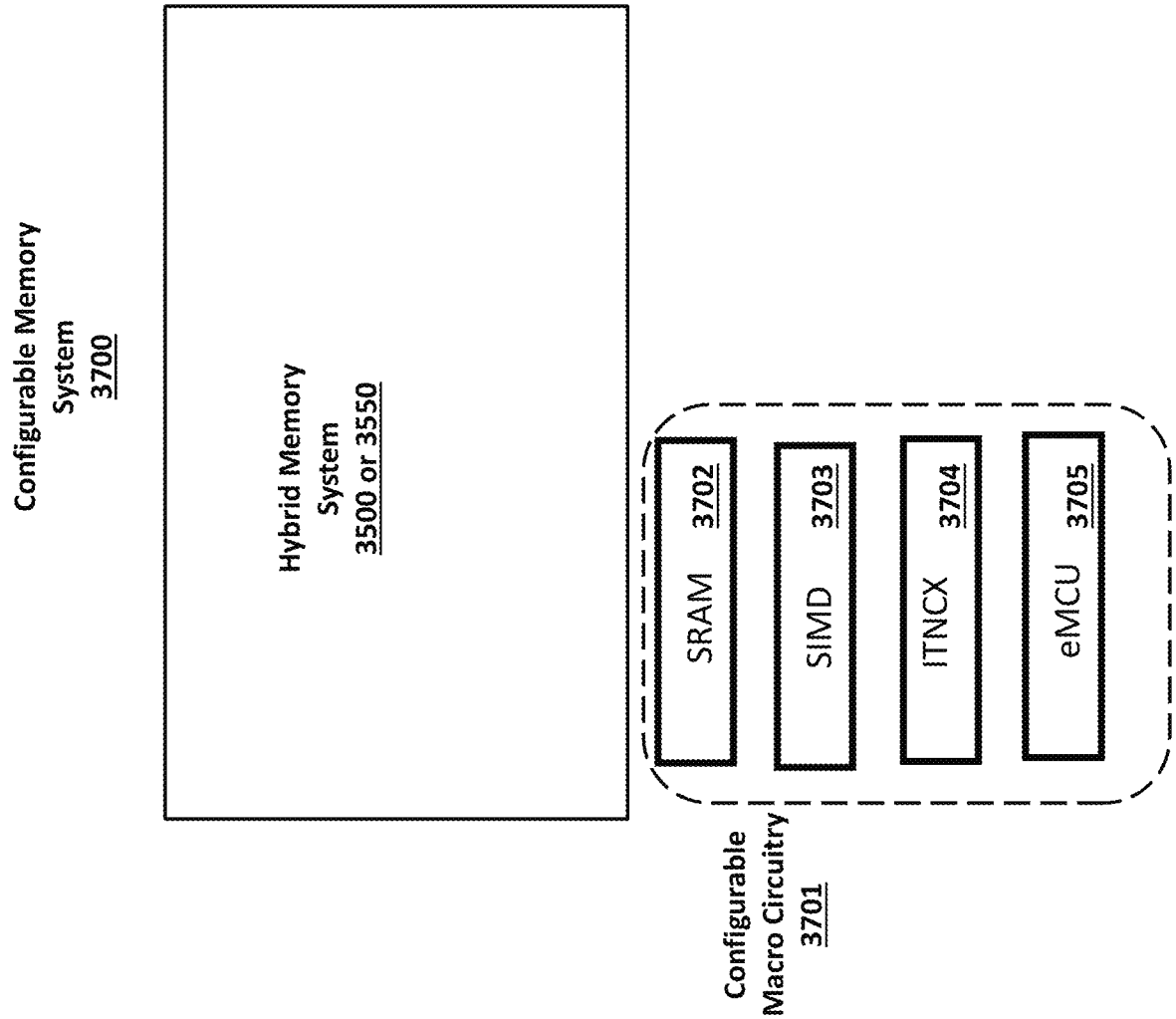
FIG. 37 depicts configurable macro circuitry for use with a hybrid memory system.

FIG. 37 depicts configurable memory system 3700, which comprises hybrid memory system 3500 or 3550, as well as configurable macro circuitry 3701. Configurable macro circuitry 3701 can be configured to operate in conjunction with a first mode or a second mode of hybrid memory system 3500 or 3550. This configuration can occur during start-up or in real-time during operation. Configurable macro circuitry 3701 optionally comprises SRAM 3702, SIMD (single instruction, multiple data instruction processing) module 3703, interconnect matrix 3704 (for connecting configurable macro circuitry 3701 to hybrid memory system 3500 or 3550), and eMCU (control unit) 3705.

Figure 38:
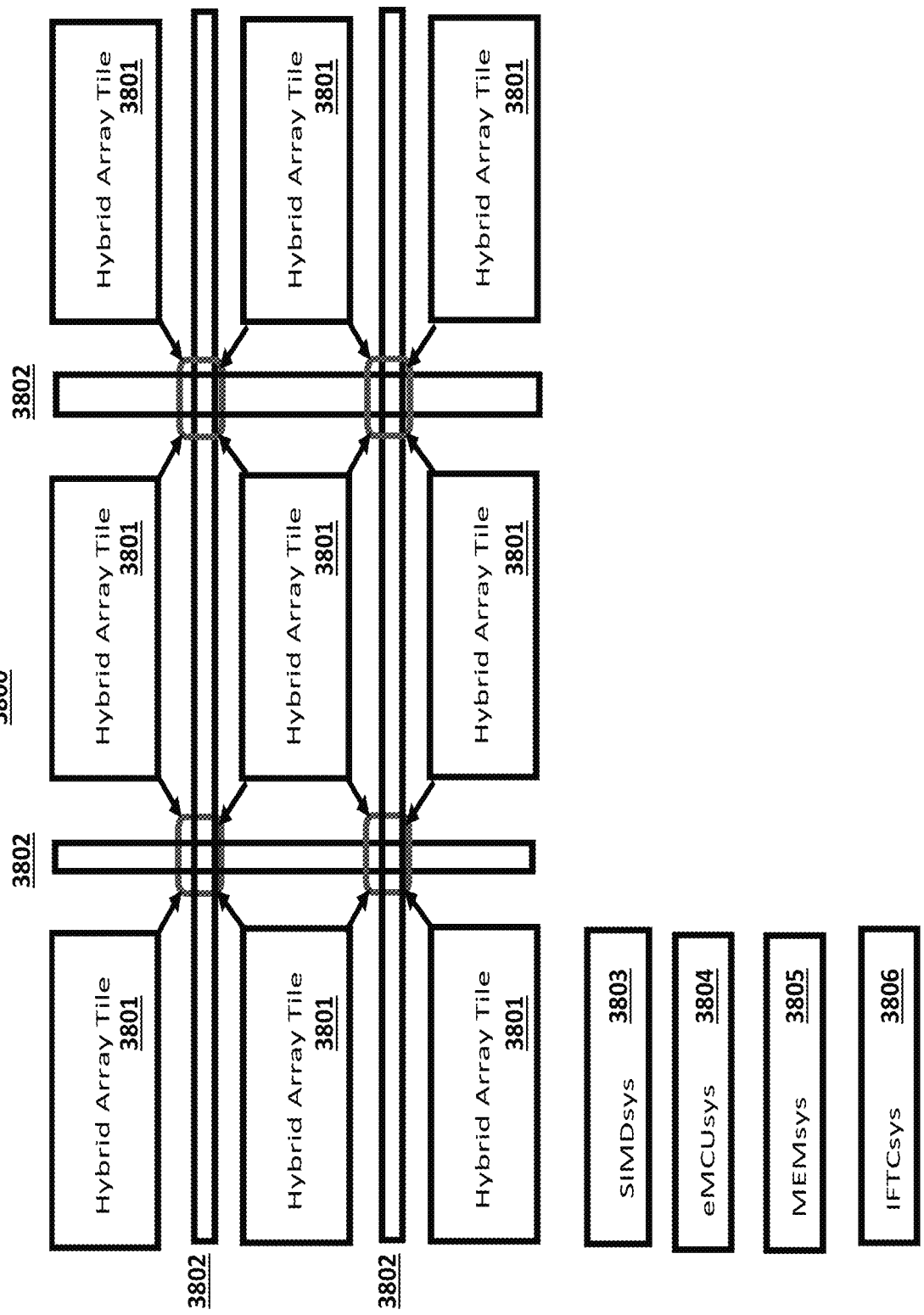
FIG. 38 depicts a system comprising a plurality of hybrid array tiles.

FIG. 38 depicts system 3800, which comprises a plurality of hybrid array tiles 3801 (each of which can comprise hybrid memory system 3500 or 3550 or 3700), interconnect 3802, system-level SIMD module 3803, eMCUsys (system-level controller) 3804, system-level memory 3805, and system-level interface IFTC 3806 (which is a high-speed interface such as OctoSPI, PCIe, Internet, etc.).

Figure 39:
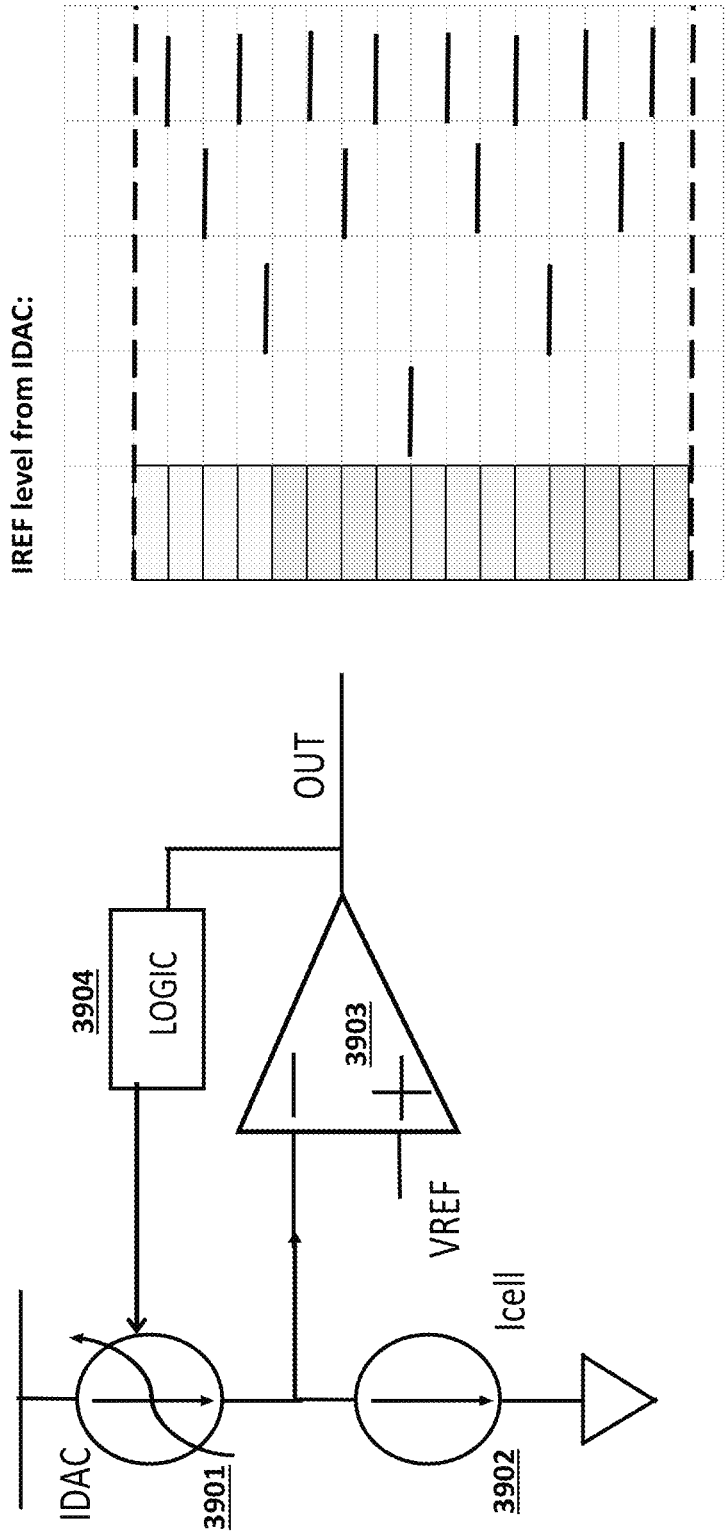
FIG. 39 depicts a reconfigurable current-to-voltage and analog-to-digital converter circuit.

FIG. 39 depicts re-configurable ITV+ADC circuit 3900. Re-configurable ITV+ADC circuit 3900 comprises adjustable current source 3901, current source 3902 (which is the selected memory cell), comparator 3903, and logic 3904. Re-configurable ITV+ADC circuit 3900 can perform as current SAR ADC with current references provided by current reference block 3901. For example, for an 8-bit current SAR ADC, the IDAC 3901 will provide 15 levels for 8 bits. The circuit is reconfigured for digital weight read or analog weigh neural read by adjusting the IDAC reference values (e.g., for read neural, IDAC reference values would be larger depending on how many rows are enabled and what is maximum bitline current for digital weight or analog weight neural read)

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:
   an array of non-volatile memory cells arranged into rows and columns;
   configurable input circuitry coupled to the array to provide an input to the array, wherein the configurable input circuitry comprises a row register and a digital-to-analog converter block for use in a first mode and a row decoder block for use in a second mode; and
   configurable output circuitry coupled to the array to provide an output received from the array in response to the input;
   wherein in the first mode, the configurable output circuitry provides digital data from the array; and
   wherein in the second mode, the configurable output circuitry provides analog data from the array.

2. The system of claim 1, wherein the digital data comprises digital weight data and the analog data comprises analog weight data.

3. The system of claim 1, wherein the configurable output circuitry comprises:
   a current-to-voltage converter and analog-to-digital converter block for use in the first mode; and
   a multi-state sense amplifier block for use in the second mode.

4. A system comprising:
   an array of non-volatile memory cells arranged into rows and columns;
   configurable input circuitry coupled to the array to provide an input to the array; and
   configurable output circuitry coupled to the array to provide an output received from the array in response to the input, wherein the configurable output circuitry comprises a current-to-voltage converter and analog-to-digital converter block for use in the first mode and a multi-state sense amplifier block for use in the second mode;
   wherein in the first mode, the configurable output circuitry provides digital data from the array; and
   wherein in the second mode, the configurable output circuitry provides analog data from the array.

5. The system of claim 1, wherein the non-volatile memory cells are stacked-gate flash memory cells.

6. The system of claim 1, wherein the non-volatile memory cells are split-gate flash memory cells.

7. The system of claim 1, wherein the system is an analog neural memory system.

8. A system comprising:
   an array of non-volatile memory cells arranged into rows and columns;
   input circuitry coupled to the array to provide an input to the array; and
   output circuitry coupled to the array to provide an output received from the array;
   wherein the input circuitry provides a digital input to the array in a first mode or an analog input to the array in a second mode; and
   wherein in the first mode, the output circuitry provides digital data from the array.

9. The system of claim 8, wherein the digital data comprises digital weight data.

10. The system of claim 8, wherein in the second mode, the output circuitry provides analog data from the array.

11. The system of claim 10, wherein the analog data comprises analog weight data.

12. A system comprising:
    an array of non-volatile memory cells arranged into rows and columns;
    input circuitry coupled to the array to provide an input to the array; and
    output circuitry coupled to the array to provide an output received from the array;
    wherein the input circuitry provides a digital input to the array in a first mode or an analog input to the array in a second mode and wherein the input circuitry comprises a row register and digital-to-analog converter block for use in the first mode and a row decoder block for use in the second mode.

13. The system of claim 12, wherein the output circuitry comprises:

a current-to-voltage converter and analog-to-digital converter block for use in the first mode; and
a multi-state sense amplifier block for use in the second mode.

14. A system comprising:
an array of non-volatile memory cells arranged into rows and columns;
input circuitry coupled to the array to provide an input to the array; and
output circuitry coupled to the array to provide an output received from the array;
wherein the input circuitry provides a digital input to the array in a first mode or an analog input to the array in a second mode; and
wherein the output circuitry comprises a current-to-voltage converter and analog-to-digital converter block for use in the first mode and a multi-state sense amplifier block for use in the second mode.

15. The system of claim 8, wherein the non-volatile memory cells are stacked-gate flash memory cells.

16. The system of claim 8, wherein the non-volatile memory cells are split-gate flash memory cells.

17. The system of claim 8, wherein the system is an analog neural memory system.

18. A system comprising:
an array of non-volatile memory cells arranged into rows and columns;
input circuitry coupled to the array to provide an input to the array, wherein the input circuitry comprises a row register and digital-to-analog converter block for use in a first mode and a row decoder block for use in a second mode; and
output circuitry coupled to the array to provide an output received from the array;
wherein the output circuitry provides a digital bit output from the array in the first mode or an analog output from the array in the second mode.

19. A system comprising:
an array of non-volatile memory cells arranged into rows and columns;
input circuitry coupled to the array to provide an input to the array; and
output circuitry coupled to the array to provide an output received from the array;
wherein the output circuitry provides a digital bit output from the array in a first mode or an analog output from the array in a second mode and wherein the output circuitry comprises a current-to-voltage converter and an analog-to-digital converter block for use in the first mode and a multi-state sense amplifier block for use in the second mode.

20. A system comprising:
an array of non-volatile memory cells arranged into rows and columns;
input circuitry coupled to the array to provide an input to the array; and
output circuitry coupled to the array to provide an output received from the array;
wherein the output circuitry provides a digital bit output from the array in a first mode or an analog output from the array in a second mode and wherein the output circuitry comprises a current-to-voltage converter and an analog-to-digital converter block for use in the first mode and a multi-state sense amplifier block for use in the second mode.

21. The system of claim 18, wherein the non-volatile memory cells are stacked-gate flash memory cells.

22. The system of claim 18, wherein the non-volatile memory cells are split-gate flash memory cells.

23. The system of claim 18, wherein the system is an analog neural memory system.

* * * * *